US012769367B2

(12) United States Patent
Sakamoto et al.

(10) Patent No.: US 12,769,367 B2
(45) Date of Patent: Oct. 20, 2026

(54) FOLDABLE DISPLAY

(71) Applicant: SHARP KABUSHIKI KAISHA, Sakai City (JP)

(72) Inventors: Mayuko Sakamoto, Sakai City (JP); Tokio Taguchi, Sakai City (JP); Yu Yamane, Sakai City (JP); Kenji Takase, Sakai City (JP); Kenji Ohtsuki, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 772 days.

(21) Appl. No.: 17/777,377

(22) PCT Filed: Dec. 6, 2019

(86) PCT No.: PCT/JP2019/047850

§ 371 (c)(1),
(2) Date: May 17, 2022

(87) PCT Pub. No.: WO2021/111619

PCT Pub. Date: Jun. 10, 2021

(65) Prior Publication Data

US 2022/0404877 A1 Dec. 22, 2022

(51) Int. Cl.
*G06F 1/16* (2006.01)
*B32B 3/26* (2006.01)
(Continued)

(52) U.S. Cl.
CPC ............ *G06F 1/1652* (2013.01); *B32B 3/266* (2013.01); *B32B 7/14* (2013.01); *B32B 15/08* (2013.01);
(Continued)

(58) Field of Classification Search
CPC ........... B32B 3/266; B32B 7/14; B32B 15/08; B32B 2457/20; G06F 1/1643; G06F 1/1652; G06F 1/1656; G06F 1/165
See application file for complete search history.

(56) References Cited

U.S. PATENT DOCUMENTS

2010/0277443 A1 11/2010 Yamazaki et al.
2013/0314346 A1 11/2013 Yamazaki et al.
(Continued)

FOREIGN PATENT DOCUMENTS

JP 2010-282181 A 12/2010
JP 2014-193605 A 10/2014
(Continued)

OTHER PUBLICATIONS

Machine Translation of JP 2018-036474 A (Year: 2018).*
(Continued)

*Primary Examiner* — Sathavaram I Reddy
(74) *Attorney, Agent, or Firm* — ScienBiziP, P.C.

(57) ABSTRACT

A foldable display includes: a display layer having flexibility, the display layer including a first display region, a second display region, and a third display region located between the first display region and the second display region; a cover having flexibility and covering the display layer; a first support substrate having inflexibility and supporting the first display region; a second support substrate having inflexibility and supporting the second display region; a bending portion including the third display region and being bendable; and a shock absorption layer disposed between the display layer and the first support substrate as well as between the display layer and the second support substrate. The shock absorption layer has a slit disposed in a portion overlapping the bending portion.

19 Claims, 17 Drawing Sheets

(51) Int. Cl.
*B32B 7/14* (2006.01)
*B32B 15/08* (2006.01)
*H10K 59/00* (2023.01)

(52) U.S. Cl.
CPC .......... *G06F 1/1643* (2013.01); *G06F 1/1656* (2013.01); *H10K 59/00* (2023.02); *B32B 2457/20* (2013.01)

(56) References Cited

U.S. PATENT DOCUMENTS

| | | | |
|---|---|---|---|
| 2014/0254112 A1 | 9/2014 | Okumoto et al. | |
| 2015/0355680 A1 | 12/2015 | Yamazaki et al. | |
| 2015/0362791 A1 | 12/2015 | Kakuda et al. | |
| 2016/0274623 A1 | 9/2016 | Yamazaki et al. | |
| 2017/0179210 A1 | 6/2017 | Kimura et al. | |
| 2017/0322598 A1 | 11/2017 | Fujimoto | |
| 2018/0069066 A1 | 3/2018 | Kimura et al. | |
| 2018/0090700 A1 | 3/2018 | Nishinohara et al. | |
| 2018/0192527 A1* | 7/2018 | Yun | G06F 1/1681 |
| 2018/0348824 A1 | 12/2018 | Yamazaki et al. | |
| 2019/0312092 A1 | 10/2019 | Kimura et al. | |
| 2021/0076511 A1* | 3/2021 | Yang | G06F 1/1641 |
| 2021/0149449 A1 | 5/2021 | Yamazaki et al. | |

FOREIGN PATENT DOCUMENTS

| | | | | |
|---|---|---|---|---|
| JP | 2016-004782 A | | 1/2016 | |
| JP | 2017-116904 A | | 6/2017 | |
| JP | 2018-036474 A | | 3/2018 | |
| JP | 2018-049209 A | | 3/2018 | |
| KR | 20190081335 A | * | 7/2019 | G06F 1/1616 |
| WO | 2016/080239 A1 | | 5/2016 | |

OTHER PUBLICATIONS

Shi et al. Analysis on the Advantages of Water Drop Shape Foldable Display (Year: 2022).*

Machine Translation of KR-20190081335-A (Year: 2019).*

* cited by examiner

| COMPONENT | THICKNESS (um) | SHOCK ABSORPTION STRUCTURE | | | | | |
|---|---|---|---|---|---|---|---|
| ADHESIVE LAYER 17 | 1~30 | ○ | ○ | - | ○ | ○ | ○ |
| PLASTIC FILM 16 | 10~80 | ○ | ○ | - | ○ | ○ | ○ |
| ADHESIVE LAYER 15 | 0~20 | ○ | ○ | - | ○ | ○ | ○ |
| METAL FILM 14 | 10~100 | 200um | <100um | 50um | ○ | ○ GLASS 50um | - |
| ADHESIVE LAYER 13 | 0~100 | - | - | ○ | ○ | ○ | ○ |
| PLASTIC FILM 12 | 10~100 | - | - | ○ | ○ | ○ | ○ |
| RESULT OF TEST OF DROPPING 100-GRAM STAINLESS-STEEL BALL | | 5cm NG | 5cm OK | 5cm NG | 15cm OK | 5cm NG | 5cm NG |

FOLDABLE DISPLAY

TECHNICAL FIELD

The disclosure relates to a foldable display.

BACKGROUND ART

Known display devices include a foldable display. A foldable display is a display device that is foldable. As one example of foldable displays, Patent Literature 1 discloses a technique.

CITATION LIST

Patent Literature

Patent Literature 1: Re-publication of PCT International Publication No. WO2016/080239 (Date of International Publication: May 26, 2016)

SUMMARY

Technical Problem

A foldable display, which requires its display layer including a display panel to have bendability, cannot be provided with a glass cover for protecting the display layer. A known foldable display is hence more vulnerable to a local shock on the display layer, which results from an object drop onto the display layer, dropping of the foldable display, or other factors, than a display device that cannot be folded.

The known foldable display thus possibly involves a breakdown at the site where such a local shock has been applied, thereby causing poor display, or possibly involves poor display, such as a bright spot or a dark dot on a display through the display layer, that results from such a local shock.

One aspect of the disclosure aims to reduce the possibility of poor display.

Solution to Problem

A foldable display according to one aspect of the disclosure includes the following: a display layer having flexibility, the display layer including a first display region, a second display region, and a third display region located between the first display region and the second display region; a cover having flexibility and covering the display layer; a first support substrate having inflexibility and supporting the first display region; a second support substrate having inflexibility and supporting the second display region; a bending portion including the third display region and being bendable; and a shock absorption layer disposed between the display layer and the first support substrate as well as between the display layer and the second support substrate. The shock absorption layer has a slit disposed in a portion overlapping the bending portion.

Advantageous Effect of Disclosure

The one aspect of the disclosure can reduce the possibility of poor display.

BRIEF DESCRIPTION OF DRAWINGS

FIG. 2 illustrates how a local shock is applied to the stacked structure.

FIG. 3 illustrates how a local shock is applied to the stacked structure.

DESCRIPTION OF EMBODIMENTS

The following descries embodiments for implementing the disclosure. For convenience in description, components having the same functions as components described previously will be denoted by the same signs, and their description will not be repeated in some cases. For simple illustration, some of the drawings omit the illustration of components other than main components.

Structural Example of Foldable Display

First Example

Figure 1:
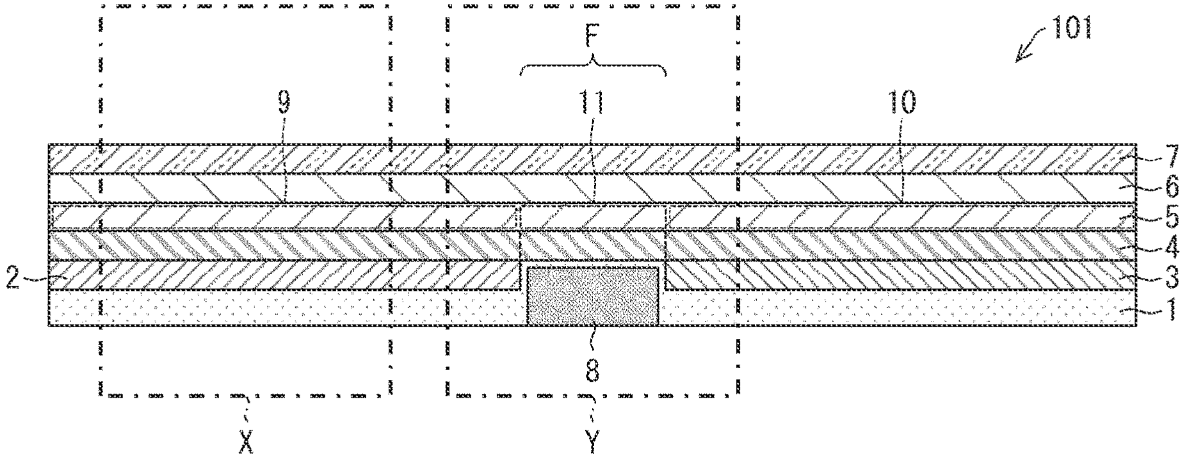
FIG. 1 is a schematic sectional view of a foldable display according to a structural example.

FIG. 1 is a schematic sectional view of a foldable display 101 according to a structural example. The foldable display 101 includes a housing 1, a first support substrate 2, a second support substrate 3, a shock absorption layer 4, a display layer 5, a function layer 6, a cover 7, and a connection plate 8. The housing 1, the first support substrate 2 as well as the second support substrate 3, the shock absorption layer 4, the display layer 5, the function layer 6, and the cover 7 in the foldable display 101 are stacked in this order. The connection plate 8 in the foldable display 101 is embedded in the housing 1.

The housing 1 is a housing having inflexibility. However, the connection plate 8 serves as a hinge, which will be described later on, and the foldable display 101 is thus foldable. Each of the first support substrate 2 and second support substrate 3 is a substrate having inflexibility and having a battery, a circuit board, and other components. The first support substrate 2 and the second support substrate 3 are spaced from each other. It is not necessary for the battery, the circuit board, and other components to be mounted on the first support substrate 2 and/or the second support substrate 3; the battery, the circuit board, and other components may be mounted on the housing 1 for instance, away from the first support substrate 2 and the second support substrate 3.

The display layer 5 has flexibility and includes a display panel that performs display. A non-limiting example of the display panel is an organic electroluminescence (EL) display panel including organic light-emitting diodes (OLEDs). The display panel may be a quantum-dot light-emitting diode (QLED) display panel for instance. The display layer 5 can be divided into three regions: a first display region 9, a second display region 10, and a third display region 11. The first display region 9 is defined as a region that located in the thickness direction of the foldable display 101 when viewed from the first support substrate 2. In other words, the first support substrate 2 supports the first display region 9. The second display region 10 is defined as a region that located in the thickness direction of the foldable display 101 when viewed from the second support substrate 3. In other words, the second support substrate 3 supports the second display region 10. The third display region 11 is a region located between the first display region 9 and the second display region 10, and the third display region 11 is defined as a region that is not supported by both of the first support substrate 2 and second support substrate 3. In some cases, the third display region 11 is supported by the connection plate 8.

The function layer 6 is a layer having flexibility and provided for implementing individual functions associated with display through the display layer 5. An example of the functions that can be implemented by the function layer 6 is a touch panel function; this example describes an instance where the function layer 6 offers a touch panel function.

The cover 7, which covers the display layer 5 and protects the display layer 5, needs to have flexibility so that the foldable display 101 can be folded. To be specific, for a cover that protects a display layer in a display device that is not foldable, a glass cover with a thickness of about several hundred micrometers can be used, but for the cover 7, a cover made of a soft material with a thickness of about several ten micrometers needs to be used. An example of the cover 7 is a well-known window film undergone a hard-coat processing.

The connection plate 8 is a plate member extending perpendicularly to the drawing sheet of FIG. 1. The connection plate 8 serves as a hinge that enables the foldable display 101 to be folded. The connection plate 8 also serves as a support for the shock absorption layer 4 and the layers above the shock absorption layer 4. The connection plate 8 is located in the thickness direction of the foldable display 101 and opposite the third display region 11 when viewed from a location between the first support substrate 2 and the second support substrate 3. A bending portion F is a portion including the third display region 11 and being bendable; the connection plate 8 supports the bending of the bending portion F about the connection plate 8, which is an axis. The foldable display 101 is foldable in a direction along the drawing sheet of FIG. 1 about the connection plate 8, which is an axis, at the bending portion F so that, for instance, the first display region 9 and the second display region 10 face.

The shock absorption layer 4 is provided for absorbing a local shock that is applied to the foldable display 101. The shock absorption layer 4 is disposed at least between the display layer 5 (first display region 9) and the first support substrate 2 as well as between the display layer 5 (second display region 10) and the second support substrate 3. The shock absorption layer 4 in the foldable display 101 is disposed also between (1) the display layer 5 (third display region 11) and (2) the first support substrate 2 as well as the second support substrate 3. The shock absorption layer 4 is preferably a structure that disperses such a local shock as described above widely rather than receives the local shock within a narrow range.

A local shock, when applied to the foldable display 101, is dispersed or absorbed by the shock absorption layer 4. As a result of this shock, the display layer 5 receives a low-strength shock actually. This can reduce the possibility of poor display resulting from a breakdown of the display layer 5, and the possibility of poor display, such as a bright spot, a dark spot, or other things appearing on a display through the display layer 5.

Figure 2:
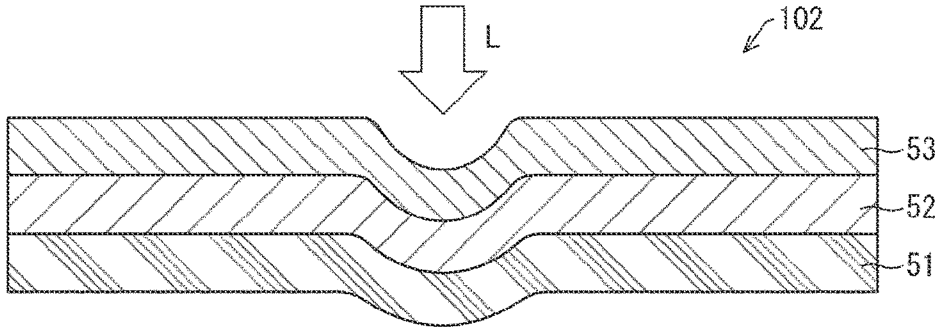
FIG. 2 is a schematic sectional view of a stacked structure corresponding to the foldable display shown in FIG. 1 with a shock absorption layer removed therefrom.

FIG. 2 is a schematic sectional view of a stacked structure 102 corresponding to the foldable display 101 with the shock absorption layer 4 removed therefrom, and FIG. 2 illustrates how a local shock L is applied to the stacked structure 102. The stacked structure 102 is a stacked structure of a layer structure 51, a display layer 52 and a layer structure 53. The layer structure 51 corresponds to a stacked structure of the housing 1 and the first support substrate 2 or second support substrate 3, and the layer structure 51 is relatively soft in order to bend the display layer 52. The display layer 52 corresponds to the display layer 5. The layer structure 53 corresponds to a stacked structure of the function layer 6 and the cover 7, and the layer structure 53 is relatively soft in order to bend the display layer 52.

The local shock L, when applied from toward the layer structure 53 to the stacked structure 102, is applied locally to the display layer 52 as well. Consequently, the display layer 52 breaks down at the site where the shock L has been applied, thereby possibly causing poor display, or a crack occurs in, but not limited to, an inorganic-substance film constituting the display layer 52, thereby causing poor display, such as a bright spot, a dark spot, or other things appearing on a display through the display layer 52.

Figure 3:
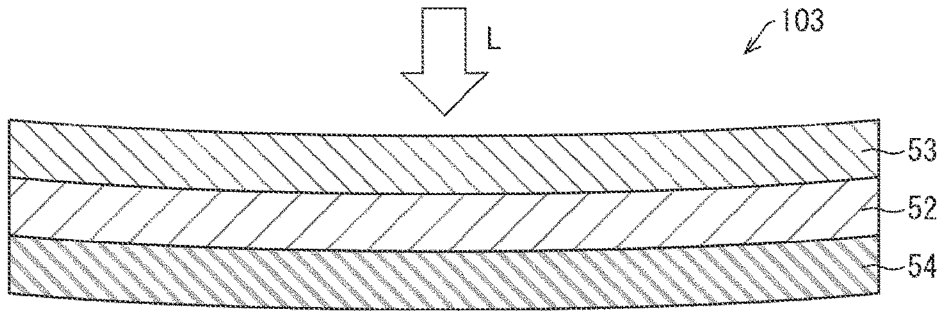
FIG. 3 is a schematic sectional view of a stacked structure corresponding to the foldable display shown in FIG. 1.

FIG. 3 is a schematic sectional view of a stacked structure 103 corresponding to the foldable display 101, and FIG. 3 illustrates how a local shock L is applied to the stacked structure 103. The stacked structure 103 is equal to the stacked structure 102 with the layer structure 51 replaced with a layer structure 54. The layer structure 54 corresponds to a stacked structure of the housing 1, the first support substrate 2 or second support substrate 3, and the shock absorption layer 4. The layer structure 54 can disperse a shock better than the layer structure 51.

The local shock L, when applied from toward the layer structure 53 to the stacked structure 103, is dispersed and absorbed by the layer structure 54. As a result of the shock L, the distribution of a shock actually received by the display layer 52 is wider and lower strength in the stacked structure 103 than in the stacked structure 102. This can reduce the possibility of poor display resulting from a breakdown of the display layer 52, and the possibility of poor display, such as a bright spot, a dark spot, or other things appearing on a display through the display layer 52.

As such, the foldable display 101 can be regarded as a foldable display with reduced possibility of poor display.

Figure 4:
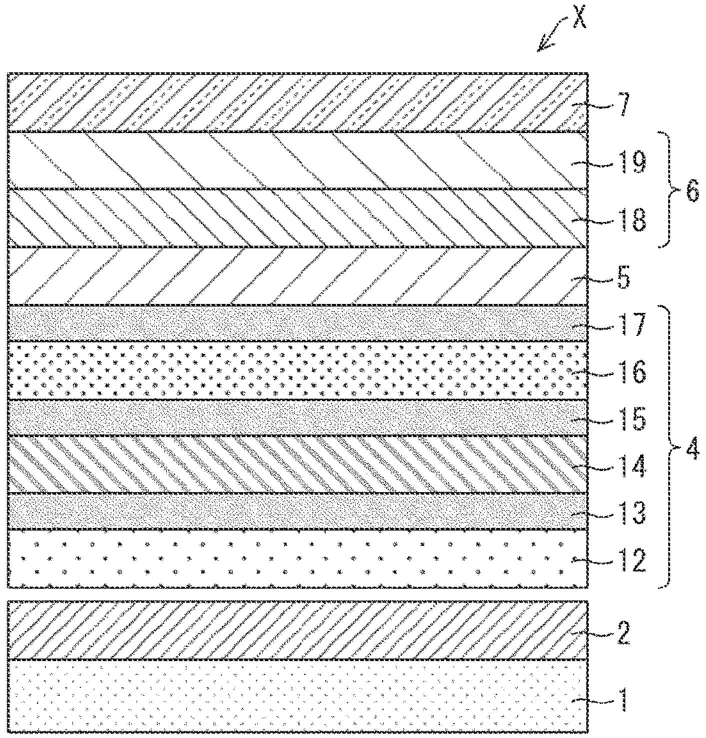
FIG. 4 illustrates in more detail an example of Range X shown in FIG. 1.

FIG. 4 illustrates in more detail an example of Range X shown in FIG. 1. The shock absorption layer 4 includes the following components in more detail. The shock absorption layer 4 includes a plastic film (second plastic film) 12, an adhesive layer 13, a metal film 14, an adhesive layer 15, a plastic film (first plastic film) 16, and an adhesive layer 17. The plastic film 12, the adhesive layer 13, the metal film 14, the adhesive layer 15, the plastic film 16, and the adhesive layer 17 in the shock absorption layer 4 are stacked in this order. The function layer 6 in more detail includes a touch panel 18 and a polarizer plate 19, which are stacked in this order.

Reference is the arrangement of the plastic film 16, plastic film 12 and metal film 14. The plastic film 16 is adjacent to the display layer 5, the plastic film 12 is opposite to the display layer 5, and the metal film 14 is interposed between the plastic film 16 and the plastic film 12.

Reference is made to the arrangement of the adhesive layer 15 and adhesive layer 13. The adhesive layer 15 is disposed between the plastic film 16 and the metal film 14, and the adhesive layer 13 is disposed between the plastic film 12 and the metal film 14.

The metal film 14 mainly has the function of dispersing a local shock applied to the foldable display 101. The metal film 14 is not deformed locally by the shock and can thus disperse the shock, thereby reducing the strength of the shock at each point. The metal film 14 preferably contains at least one of stainless steel, aluminum, and copper. The metal film 14 preferably has a thickness of 10 to 100 μm inclusive and more preferably has a thickness of 20 to 50 μm inclusive.

The plastic film 16 mainly has the function of absorbing a shock dispersed by the metal film 14. The plastic film 16 is preferably a film containing at least one of polyimide, polyethylene terephthalate (PET), polyethylene naphthalate (PEN), cyclic olefin copolymer (COC), and aramid. The plastic film 16 is preferably thicker than the metal film 14. The plastic film 16 is preferably harder than the plastic film 12.

Like the plastic film 16, the plastic film 12 mainly has the function of absorbing a shock dispersed by the metal film 14. The plastic film 12 is preferably a film containing at least one of PET, urethane-based resin, polyester-based resin, acrylic-based resin, and polycarbonate resin. The plastic film 12 may be a foamed molded object, or a part of a sheet having the function of thermal diffusion. Such a sheet having the function of thermal diffusion may contain graphite. The plastic film 12 is preferably as thick as the plastic film 16 or is preferably thicker than the plastic film 16. The plastic film 12 may be a stacked structure of a plurality of layers containing materials different from each other.

The Young's modulus of the plastic film 16 is preferably larger than the Young's modulus of the plastic film 12. To be specific, it is preferable to select resin materials different from each other for the respective plastic film 12 and plastic film 16 in such a manner that the Young's modulus of the plastic film 16 is larger than the Young's modulus of the plastic film 12. For an identical resin material, a Young's modulus increases along with increase in density; hence, when the plastic film 12 and the plastic film 16 are made of the same resin, the plastic film 16 preferably has a higher density of resin than the plastic film 12. For instance, polyimide has a Young's modulus of 2 to 8 GPa inclusive, PET has a Young's modulus of 4 GPa, PEN has a Young's modulus of 7 GPa, COC has a Young's modulus of 3 GPa, aramid has a Young's modulus of 10 GPa, urethane-based resin has a Young's modulus of 0.5 GPa, acrylic-based resin has a Young's modulus of 3 GPa, and polycarbonate resin has a Young's modulus of 2.3 GPa.

In the foldable display 101, a shock is less likely to propagate to the display layer 5 due to the plastic film 16. If a shock is applied from toward the cover 7 to the foldable display 101 however, the plastic film 16 receives the shock before the metal film 14 does. The plastic film 16 hence preferably has an elasticity coefficient of 1 to 10 GPa inclusive, and it is desirable that the elasticity coefficient be large as much as possible within this range. This can sufficiently weaken a shock that is received by the metal film 14, thereby reducing the possibility that the metal film 14 cannot disperse the shock fully.

Each of the adhesive layer 13 and the adhesive layer 15 may be composed of a self-adhesion agent. The adhesive layer 17 preferably has an elasticity coefficient of 0.1 to 0.6 MPa inclusive, and it is desirable that the elasticity coefficient be large as much as possible within this range. The plastic film 16 and the adhesive layer 17 may serve as a protective film for protecting the base material of the display layer 5.

The adhesive layer 13 is unnecessary when the plastic film 12 and the metal film 14 can be joined together without the use of an adhesive material, such as an instance of applying a liquid material to the metal film 14 to form the plastic film 12. For no use of the adhesive layer 15, there is air slightly between the plastic film 16 and the metal film 14.

Although the shock absorption layer 4 in the foldable display 101 is joined to the display layer 5, the shock absorption layer 4 may be joined to the first support substrate 2 and the second support substrate 3. Further, the first support substrate 2 as well as the second support substrate 3, and the shock absorption layer 4 do not have to be joined to each other; they only have to be in contact with each other.

The touch panel 18 is disposed between the display layer 5 and the cover 7. To integrate the display layer 5 and the touch panel 18 by forming the touch panel 18 onto the display panel of the display layer 5, it is unnecessary to place an adhesive layer between the display layer 5 and the touch panel 18. The polarizer plate 19 is composed of, but not limited to, a polyvinyl alcohol (PVA)-based polarization film and a λ/4 waveplate.

Although two support substrates, i.e., the first support substrate 2 and the second support substrate 3, are used in the foldable display 101, three or more support substrates may be used. Although there is one bending portion F in the foldable display 101, there may be two or more bending portions F. The thickness of the plastic film 12 and/or the thickness of the plastic film 16 may be smaller than the thickness of the metal film 14. Each layer shown in FIG. 4 does not necessarily have to be a monolayer; each layer may be composed of a stacked structure of a plurality of layers.

A thermal-diffusion function layer made of, for instance, graphite may be placed in a location being adjacent to the plastic film 12 when viewed from the metal film 14. The thermal-diffusion function layer may be disposed on the plastic film 12 directly or with an adhesive layer interposed therebetween, or the thermal-diffusion function layer may be disposed between the metal film 14 and the plastic film 12. The thermal-diffusion function layer, which diffuses (dissipates) heat, can prevent thermal damage to the light-emitting elements (e.g., OLEDs or QLEDs) within the display layer 5, thereby prolonging the life of the foldable display 101.

Figure 5:
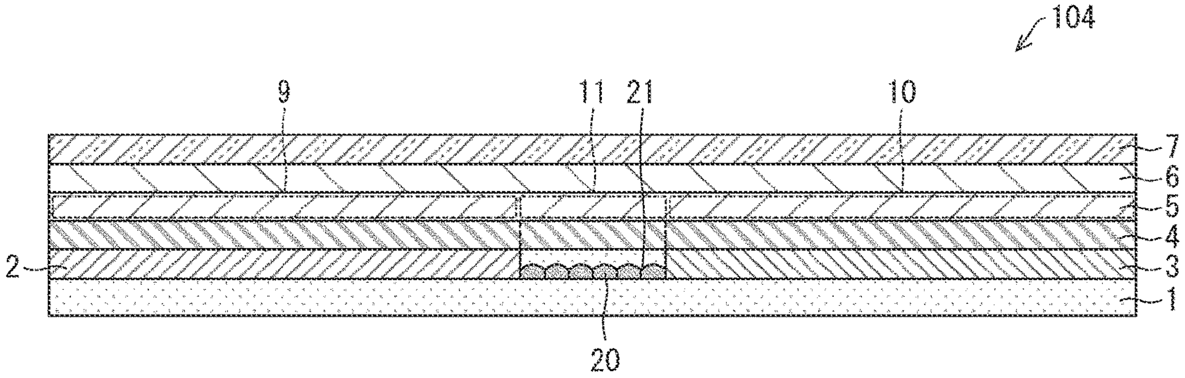
FIG. 5 is a schematic sectional view of a foldable display according to a modification of the structural example.

FIG. 5 is a schematic sectional view of a foldable display 104 according to a modification of the structural example. The foldable display 104 is equal to the foldable display 101 with the connection plate 8 replaced with a connection plate 20.

The connection plate 20 is different from the connection plate 8 in the following points: the connection plate 20 is disposed between the first support substrate 2 and the second support substrate 3, and the connection plate 20 has a plurality of grooves 21 extending perpendicularly to the drawing sheet of FIG. 5.

The connection plate 8 in the foldable display 101 has two ends for folding: one of them is an end adjacent to the first support substrate 2, and the other is an end adjacent to the second support substrate 3. The connection plate 20 in the foldable display 104 in contrast, which has the plurality of grooves 21 each serving as an end for folding, has five ends for folding. The foldable display 104 is thus foldable in more folds than the foldable display 101. As such, the bending of the bending portion F can be changed in various ways.

Second Example

Figure 6:
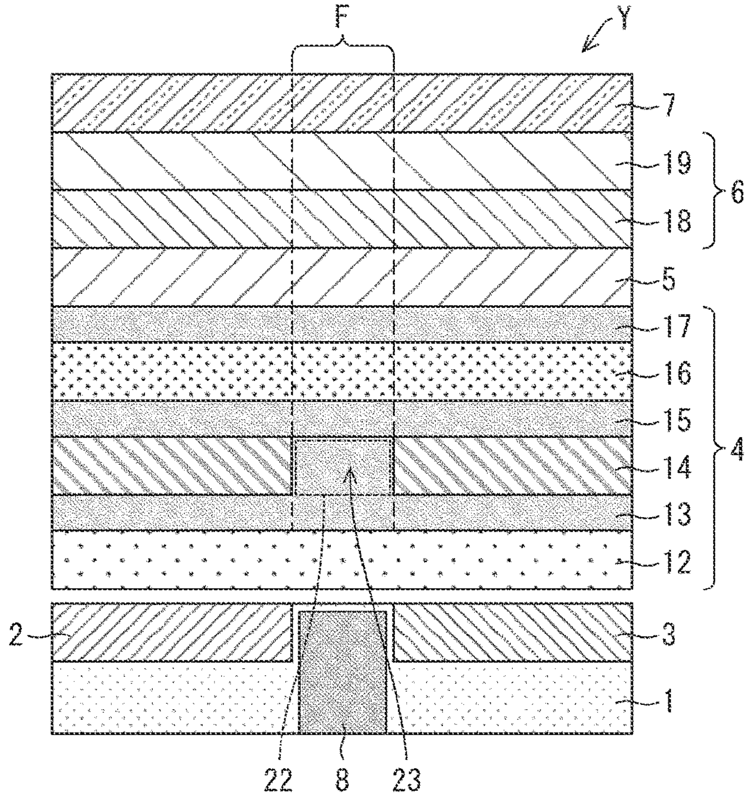
FIG. 6 illustrates in more detail an example of Range Y shown in FIG. 1.

FIG. 6 illustrates in more detail an example of Range Y shown in FIG. 1. Range Y shown in FIG. 6 is different from Range X shown in FIG. 4 in that the connection plate 8 is provided as well as in the following point.

Range Y shown in FIG. 6 includes an overlap portion 22, which is a portion of the metal film 14 overlapping the bending portion F, has a single gap 23. The adhesive layer 13 is disposed to fill a space produced as a result of forming the gap 23.

Figure 7:
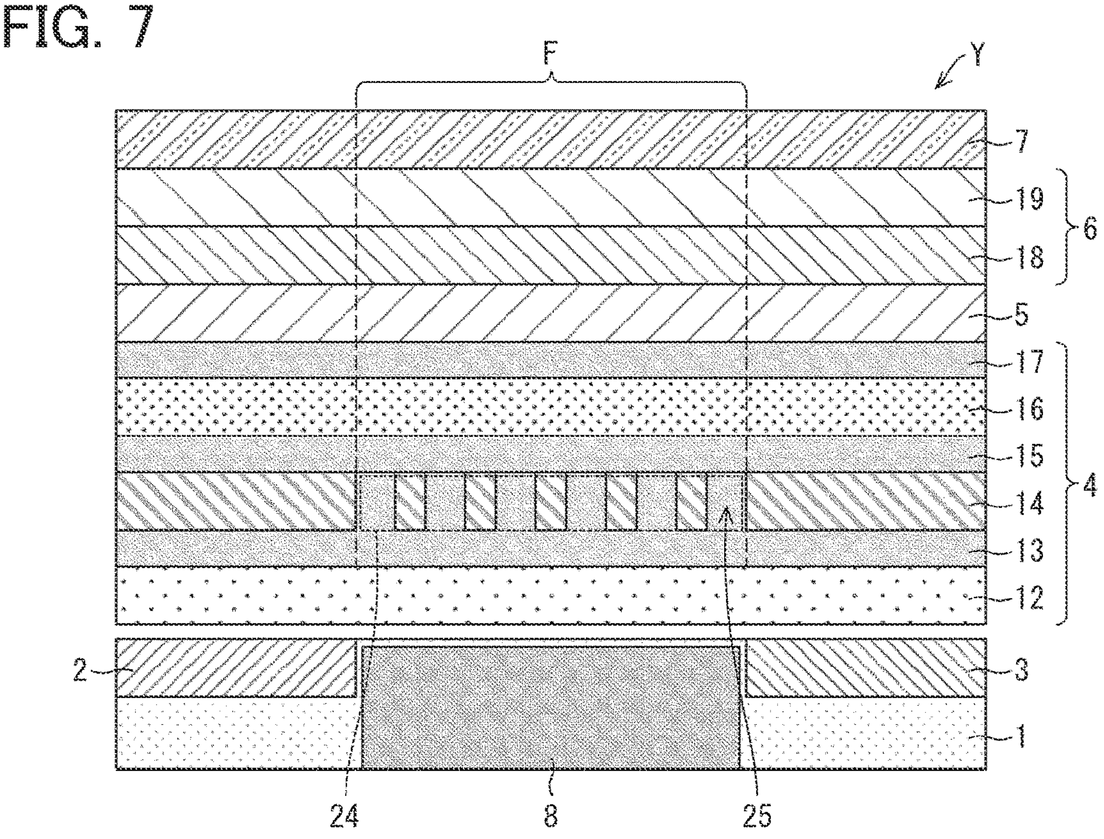
FIG. 7 illustrates in more detail another example of Range Y shown in FIG. 1.

FIG. 7 illustrates in more detail another example of Range Y shown in FIG. 1. Range Y shown in FIG. 7 is different from Range X shown in FIG. 4 in that the connection plate 8 is provided as well as in the following point.

Range Y shown in FIG. 7 includes an overlap portion 24, which is a portion of the metal film 14 overlapping the bending portion F, has a plurality of gaps 25. The adhesive layer 13 is disposed to fill all spaces produced as a result of forming the plurality of gaps 25, but the gaps 25 do not have to be filled with the adhesive layer 13 entirely and may include an air layer.

The second moment of area of the overlap portion 24 is smaller than the second moment of area of the metal film 14 excluding the overlap portion 24. That is, the second moment of area of the overlap portion 24 is smaller than the second moment of area of the metal film 14 overlapping the first support substrate 2 and is smaller than the second moment of area of the metal film 14 overlapping the second support substrate 3. Second moment of area is a value indicating how hard the sectional shape of a component is against bending; in other words, second moment of area is a quantity indicating how much a component is insusceptible to deformation with respect to bending moment. The value of second moment of area changes together with changes in the section of a component.

Figure 8:
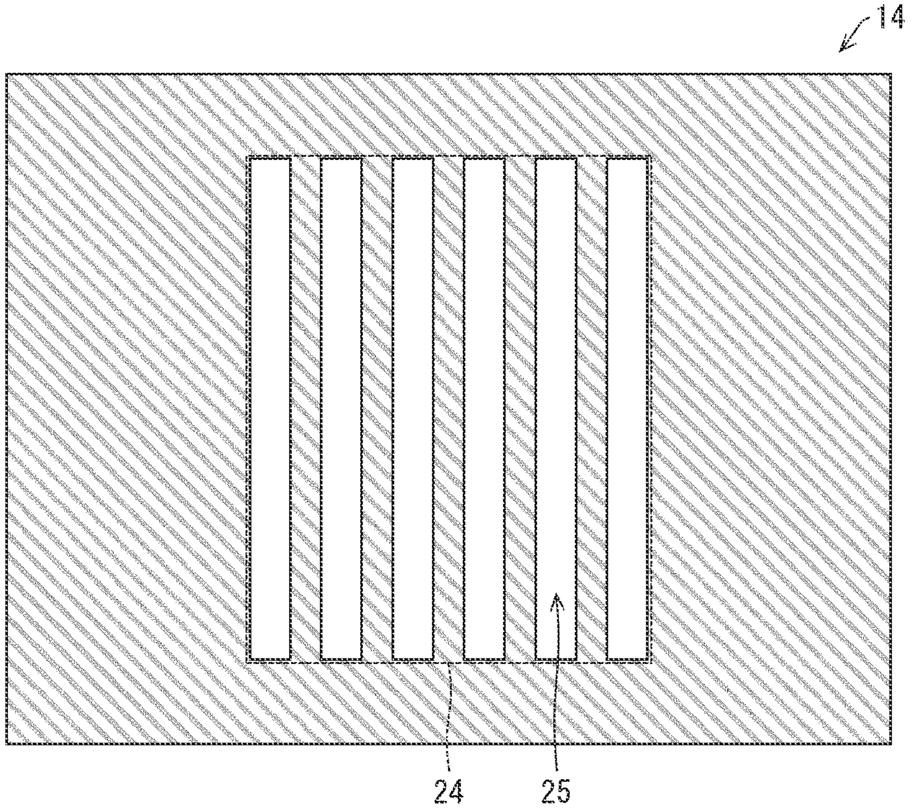
FIG. 8 is a plan view of an example of a metal film having gaps.

FIG. 8 is a plan view of an example of the metal film 14 with the gaps 25. The metal film 14 shown in FIG. 8 has the gap 25 inside the overlap portion 24 but has no gaps 25 outside the overlap portion 24. That is, the metal film 14 shown in FIG. 8 is a single plate-shape member having the gaps 25 inside the overlap portion 24.

Figure 9:
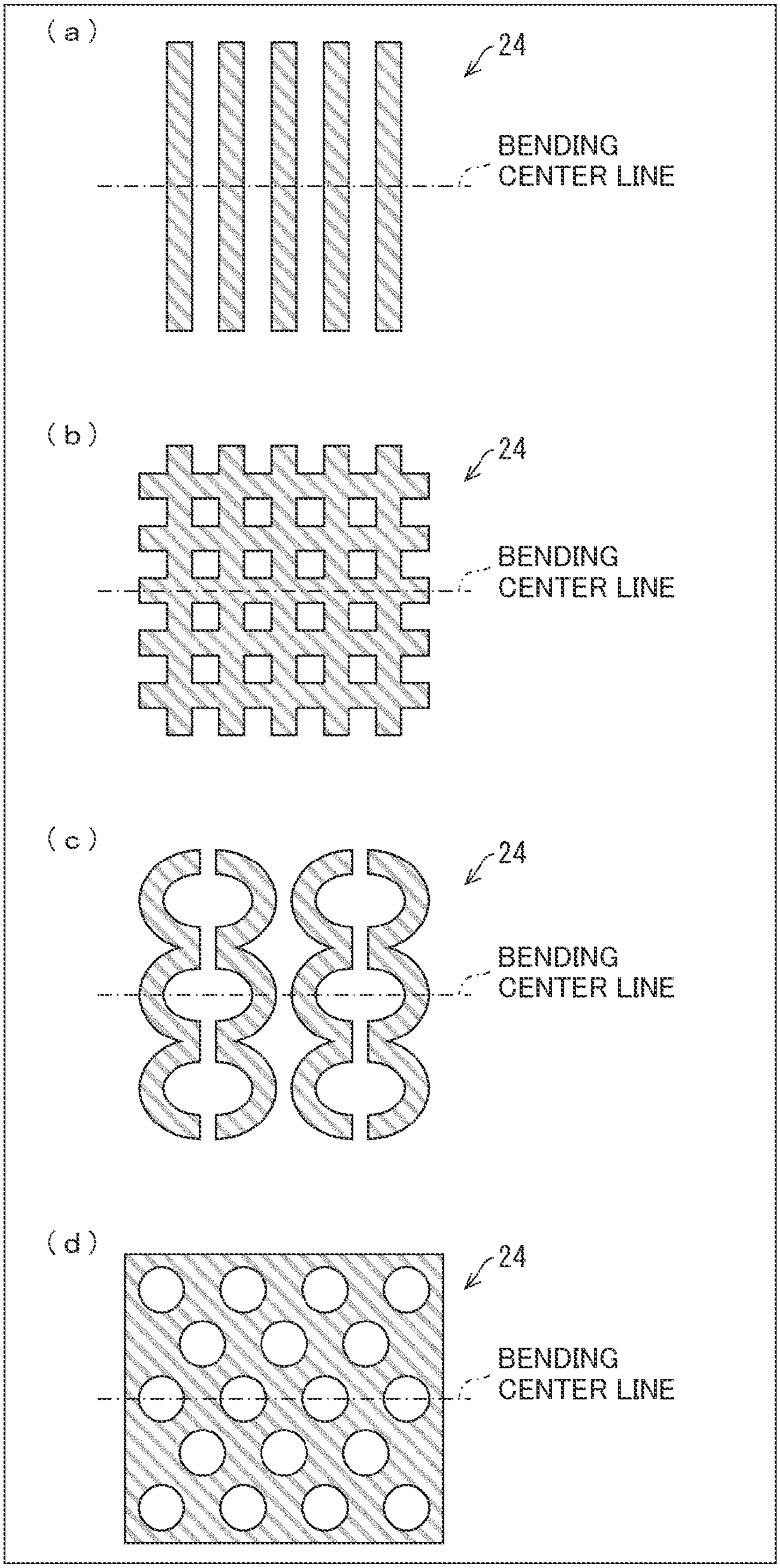
FIG. 9(*a*) is a plan view of an example part of the metal film overlapping a bending portion, and FIGS. 9(*b*) to (*d*) are each a plan view of a modification of FIG. 9(*a*).

FIG. 9(*a*) is a plan view of one example of the overlap portion 24. Each of FIGS. 9(*b*) to (*d*) is a plan view of a modification of FIG. 9(*a*). For easy illustration, all parts but the overlap portion 24 of the metal film 14 are omitted in each of FIGS. 9(*a*) to (*d*).

The plan view of the overlap portion 24 shown in FIG. 9(*a*) matches the plan view of the foldable display 101. The overlap portion 24 shown in FIG. 9(*a*) has a grating shape in a plan view. Other than a grating shape, the overlap portion 24 may have a lattice shape in a plan view, as illustrated in FIG. 9(*b*); alternatively, the overlap portion 24 may have a chain shape in a plan view, as illustrated in FIG. 9(*c*), which is herein a plurality of chain shapes; alternatively, the overlap portion 24 may have a plate shape with dot-shape cuts, as illustrated in FIG. 9(*d*).

Shaping the overlap portion 24 into a grating, a lattice, or a chain in the plan view of the foldable display 101 can both prevent wrinkles in the bending portion F and strengthen the bending portion F.

Not only the overlap portion 24, but also the entire metal film 14 may have a grating shape, a lattice shape, or a chain shape in the plan view of the foldable display 101 (in other words, in the plan view of the metal film 14). These shapes can both prevent wrinkles in the bending portion F and strengthen the bending portion F. This configuration is suitable when the size of the entire metal film 14 is small.

Third Example

Figure 10:
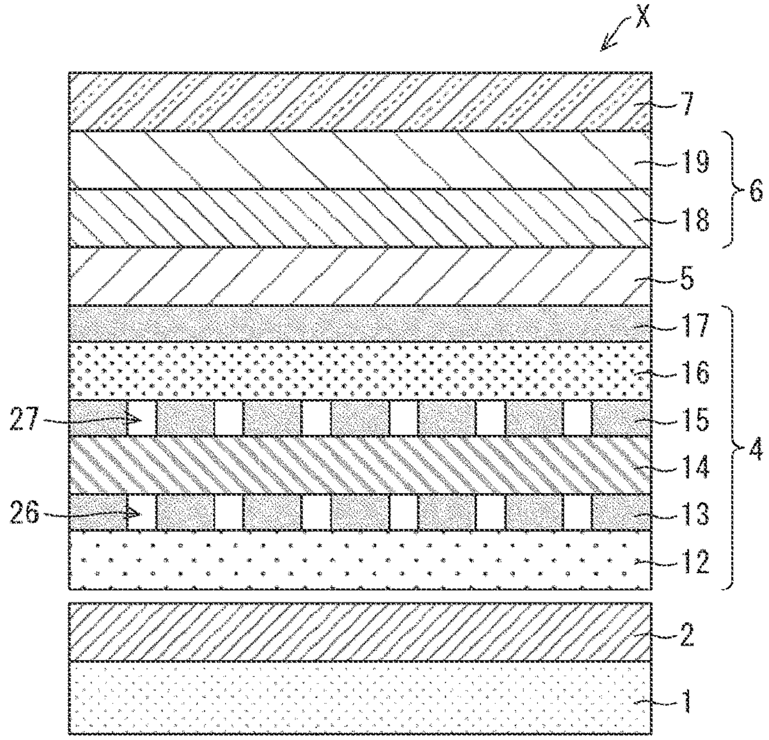
FIG. 10 illustrates in more detail another example of Range X shown in FIG. 1.

FIG. 10 illustrates in more detail another example of Range X shown in FIG. 1. Range X shown in FIG. 10 is different from Range X shown in FIG. 4 in the following point.

The adhesive layer 13 includes a plurality of air layers 26 disposed all over the adhesive layer 13. In other words, the adhesive layer 13 has a plurality of gaps, and there is air in each of a plurality of spaces produced as a result of forming these gaps.

The adhesive layer 15 includes a plurality of air layers 27 disposed all over the adhesive layer 15. In other words, the adhesive layer 15 has a plurality of gaps, and there is air in each of a plurality of spaces produced as a result of forming these gaps.

Figure 11:
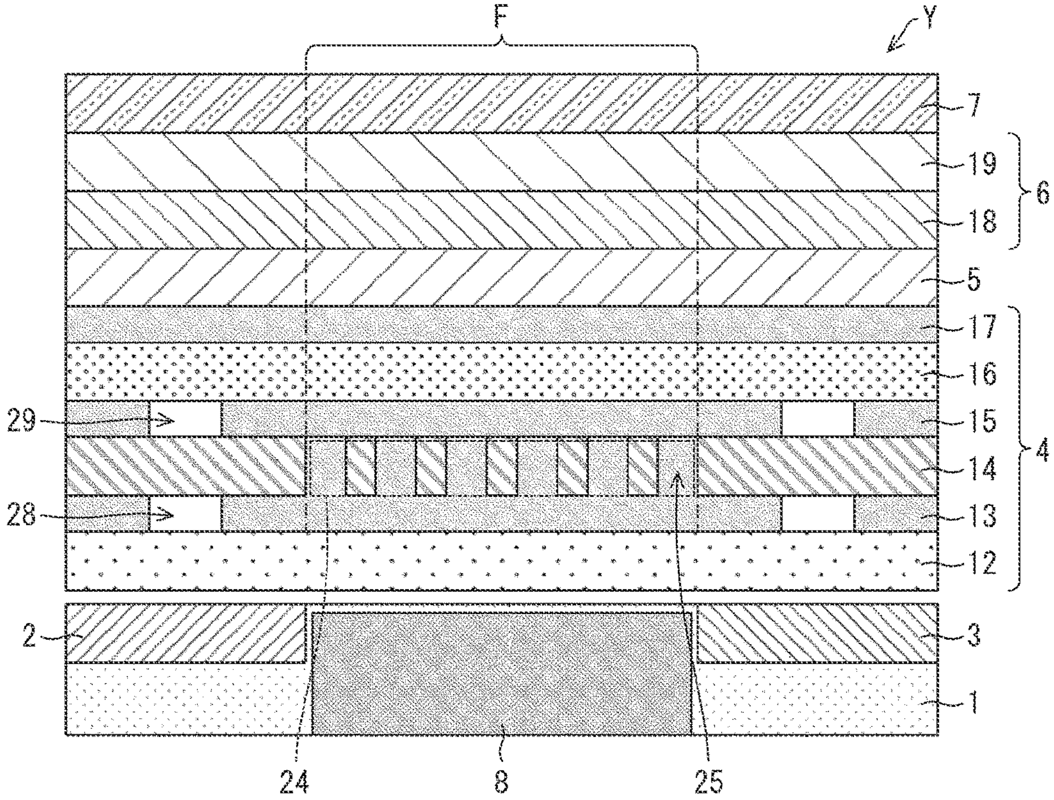
FIG. 11 illustrates in more detail further another example of Range Y shown in FIG. 1.

FIG. 11 illustrates in more detail further another example of Range Y shown in FIG. 1. Range Y shown in FIG. 11 is different from Range Y shown in FIG. 7 in the following point.

The adhesive layer 13 includes a plurality of air layers 28 disposed outside the overlap portion 24 of the metal film 14. In other words, the adhesive layer 13 has a plurality of gaps, and there is air in each of a plurality of spaces produced as a result of forming these gaps.

The adhesive layer 15 includes a plurality of air layers 29 disposed outside the overlap portion 24 of the metal film 14. In other words, the adhesive layer 15 has a plurality of gaps, and there is air in each of a plurality of spaces produced as a result of forming these gaps.

Figure 12:
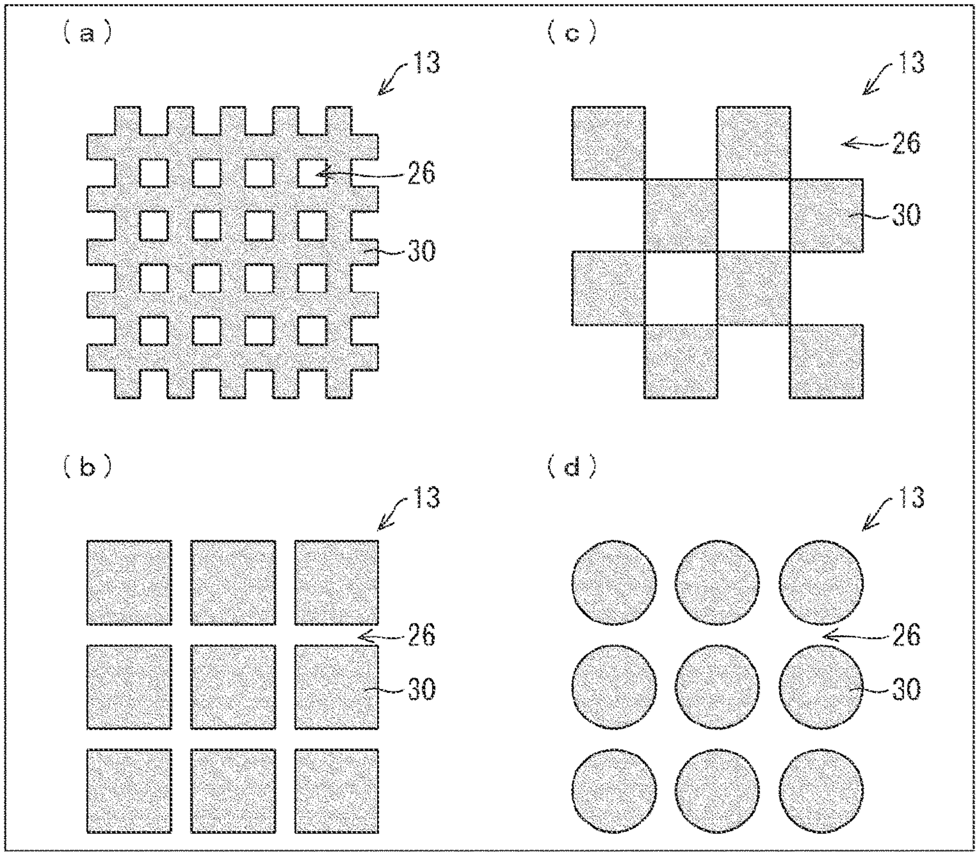
FIG. 12(*a*) is a plan view of an example adhesive layer having an air layer, and FIG. 12(*b*) to (*d*) are each a plan view of a modification of FIG. 12(*a*).

FIG. 12(*a*) is a plan view of one example of the adhesive layer 13 with the air layers 26. Each of FIGS. 12(*b*) to (*d*) is a plan view of a modification of FIG. 12(*a*). For easy illustration, all parts but the adhesive layer 13 are omitted in each of FIGS. 12(*a*) to (*d*).

The adhesive layer 13 is composed of an adhesive 30 and the air layers 26. The plan view of the adhesive layer 13 shown in FIG. 12(*a*) matches the plan view of the foldable display 101. The adhesive 30 of the adhesive layer 13 shown in FIG. 12(*a*) has a lattice shape in the plan view of the adhesive layer 13. Other than a lattice shape, the adhesive 30 of the adhesive layer 13 may have a multi-square shape in the plan view of the adhesive layer 13, as illustrated in FIG. 12(*b*); alternatively, the adhesive 30 may have a checkered shape in the plan view of the adhesive layer 13, as illustrated in FIG. 12(*c*); alternatively, the adhesive 30 may have a dot shape in the plan view of the adhesive layer 13, as illustrated in FIG. 12(*d*).

Providing the air layers 26 within the adhesive layer 13 enables the metal film 14 to vibrate upon receiving a shock. When the metal film 14 vibrates upon receiving the shock, positional energy based on the shock is partly converted into kinetic energy. This can reduce physical damage to the foldable display 101 effectively.

Like the combination of the adhesive layer 13 and air layers 26, the combination of the adhesive layer 15 and air layers 27, the combination of the adhesive layer 13 and air layers 28, and the combination of the adhesive layer 15 and air layers 29 can achieve a similar effect.

The adhesive layer 13 or the adhesive layer 15 may be an adsorbent layer having the function of self-adhesion. The configuration where the adhesive layer 13 includes the air layers 28 and/or the configuration where the adhesive layer 15 includes the air layers 29 may be applied to Range Y shown in FIG. 6.

Fourth Example

Figure 13:
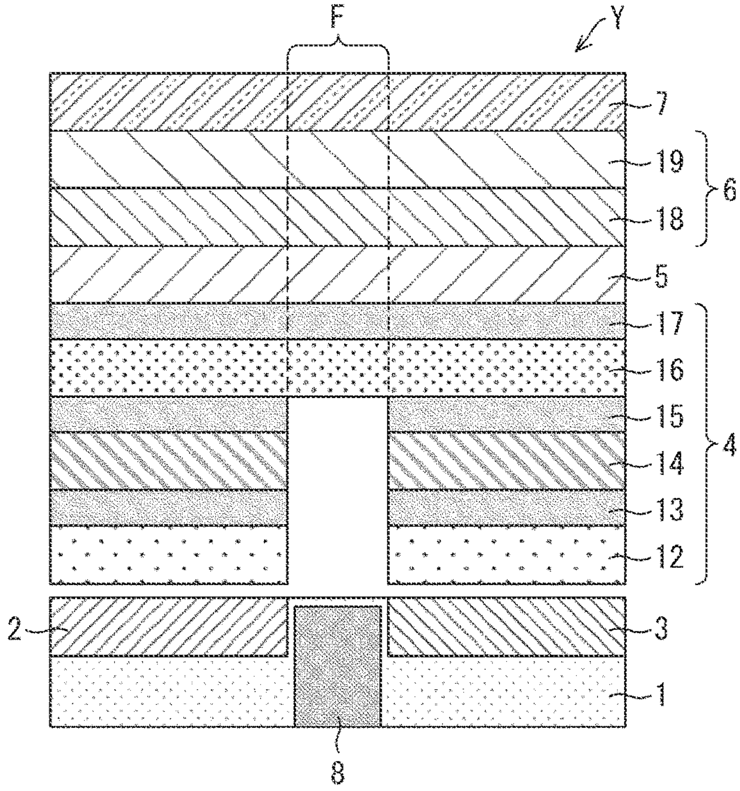
FIG. 13 illustrates a modification of Range Y shown in FIG. 6.

FIG. 13 illustrates in more detail a modification of Range Y shown in FIG. 6. Range Y shown in FIG. 13 is different from Range Y shown in FIG. 6 in that the plastic film 12, the adhesive layer 13, the metal film 14, and the adhesive layer 15 are each not disposed in the bending portion F and are each separated into a plurality of parts (herein, two parts) with the bending portion F interposed therebetween.

Figure 14:
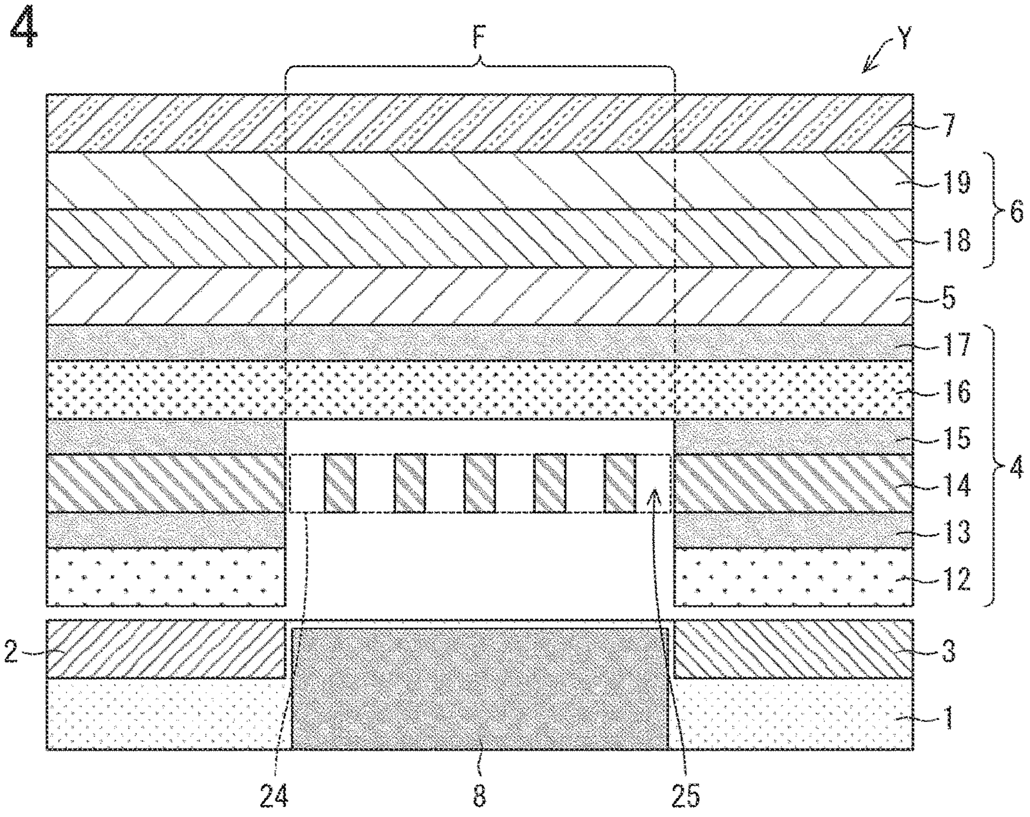
FIG. 14 illustrates a modification of Range Y shown in FIG. 7.

FIG. 14 illustrates a modification of Range Y shown in FIG. 7. Range Y shown in FIG. 14 is different from Range Y shown in FIG. 7 in that the plastic film 12, the adhesive layer 13, and the adhesive layer 15 are each not disposed in the bending portion F and are each separated into a plurality of parts (herein, two parts) with the bending portion F interposed therebetween.

Figure 15:
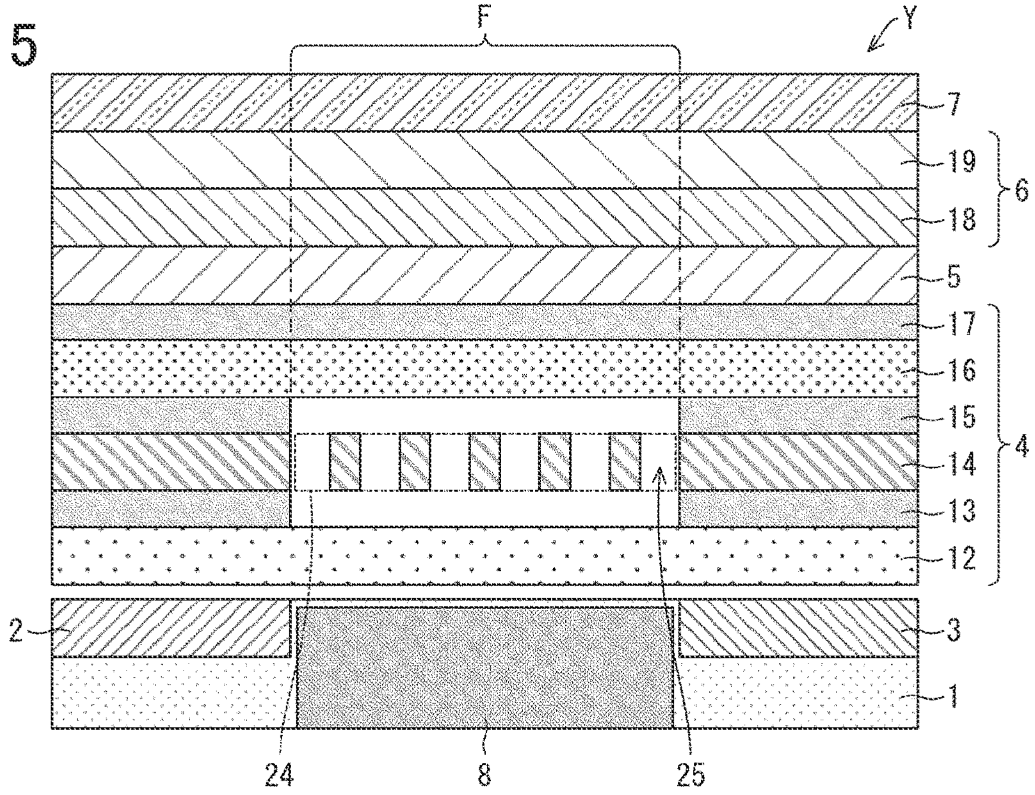
FIG. 15 illustrates a modification of Range Y shown in FIG. 14.

FIG. 15 illustrates a modification of Range Y shown in FIG. 14. Range Y shown in FIG. 15 is different from Range Y shown in FIG. 14 in that the plastic film 12 is disposed in the bending portion F.

Each of the foregoing configurations can reduce the number of components that are included in the bending portion F, thereby allowing the bending portion F to be easily bent.

In the respective examples shown in FIG. 13 to FIG. 15, it is not essential that at least the plastic film 12, adhesive layer 13, and adhesive layer 15 are each not disposed in the bending portion F.

Test Results

Figures 16, 17:
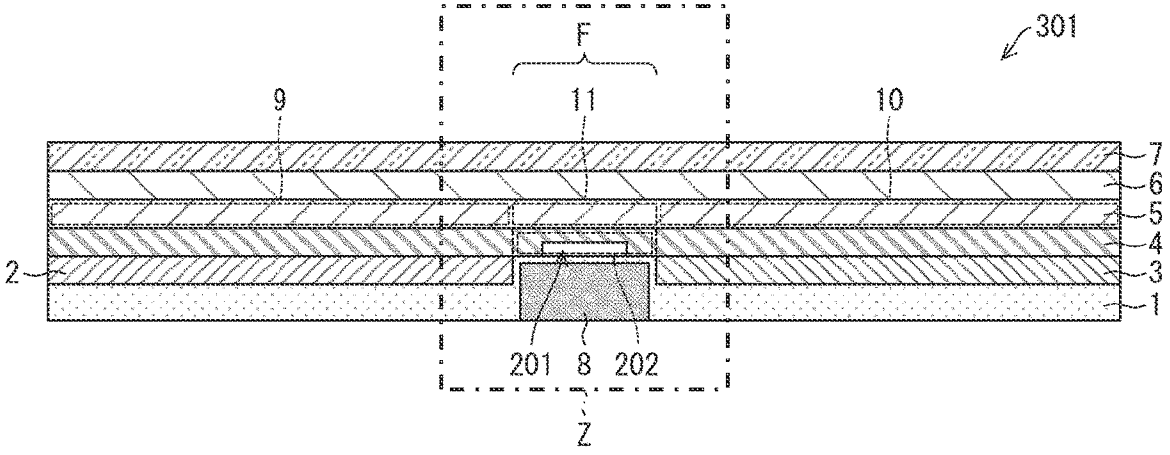
FIG. 16 is a table showing the thickness of each component constituting the shock absorption layer of the foldable display shown in FIG. 1, and showing the results of a shock absorption test.
FIG. 17 is a schematic sectional view of a foldable display according to a first embodiment of the disclosure.

FIG. 16 is a table showing the thickness of each component constituting the shock absorption layer 4 of the foldable display 101, and showing the results of a shock absorption test. The specific configuration of the shock absorption layer 4 is based on the first example described above.

Reference is made to the table's columns (except for the item "result of test of dropping 100-gram stainless-steel ball", which is recited in the table's row). The item "component" indicates each component constituting the shock absorption layer 4. The item "thickness (μm)" indicates the range of a thickness (unit: μm) corresponding to each component listed in the item "component". In the item "shock absorption structure", the symbol "○" indicates "with component", and the symbol "–" indicates "without component". The meanings of symbols other than the symbols "○" and "–" are as follows. For a value that is to be noted specially, such as a component having a thickness falling outside the range in the item "thickness (μm)", the thickness is recited in the item "shock absorption structure". For replacement of the metal film 14 with a glass film, the symbol "○" as well as "glass" is recited in the item "shock absorption structure".

Reference is now made to the table's row, i.e., the item "result of test of dropping 100-gram stainless-steel ball". This item indicates the results of a test where the foldable display 101 is placed with the cover 7 up, followed by dropping a 100-gram stainless-steel ball to hit on the cover 7. In the test results, "OK" indicates that no poor display has occurred in the foldable display 101, and "NG" indicates that poor display has occurred in the foldable display 101. The distance of dropping of the stainless-steel ball (the height of a dropping start position of the stainless-steel ball measured from the upper surface of the foldable display 101) is recited together with "OK" or "NG".

FIG. 16 demonstrates that providing the plastic film 16, the plastic film 12 and the metal film 14 can achieve the shock absorption layer 4 with high performance of shock absorption.

First Embodiment

FIG. 17 is a schematic sectional view of a foldable display 301 according to a first embodiment of the disclosure. The foldable display 301 is different from the foldable display 101 in that a slit 201 is provided.

The slit 201 is disposed in an overlap portion 202, which is a portion of the shock absorption layer 4 overlapping the bending portion F.

Providing the slit 201 in the overlap portion 202 can prevent a stress that is caused by the shock absorption layer 4 when the foldable display 301 is folded, from hindering the bending of the bending portion F. This can achieve the foldable display 301 that is easy to fold.

Figure 18:
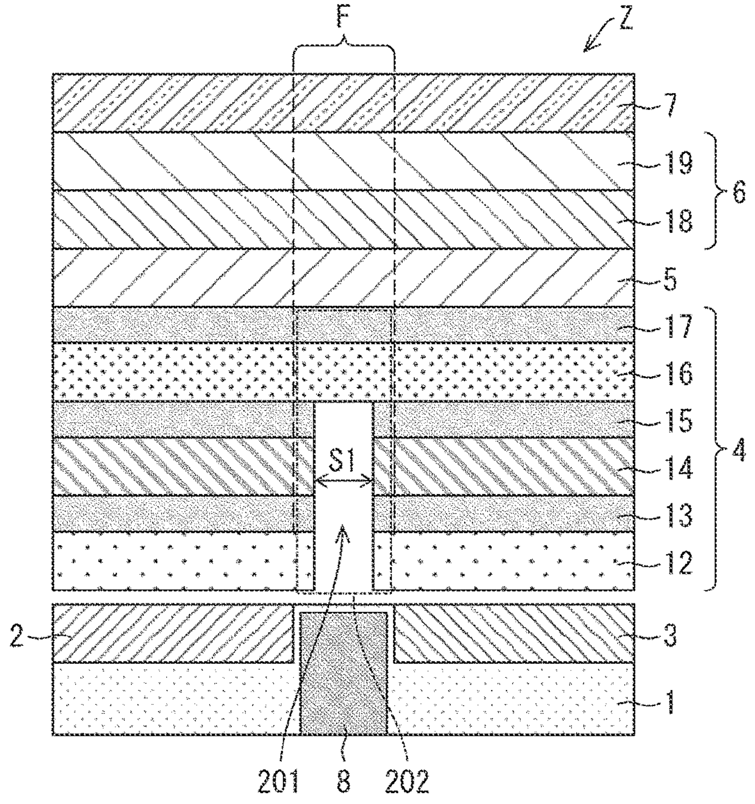
FIG. 18 illustrates in more detail an example of Range Z shown in FIG. 17.

FIG. 18 illustrates in more detail an example of Range Z shown in FIG. 17. Range Z shown in FIG. 18 is different from Range Y shown in FIG. 6 in the following point.

The slit 201 is open to the shock absorption layer 4 adjacent to the first support substrate 2 and second support substrate 3. The slit 201 extends from the surface adjacent to the first support substrate 2 and second support substrate 3, sequentially to the plastic film 12, the adhesive layer 13, the metal film 14, and the adhesive layer 15. The width of the slit 201 is denoted by S1.

Figure 19:
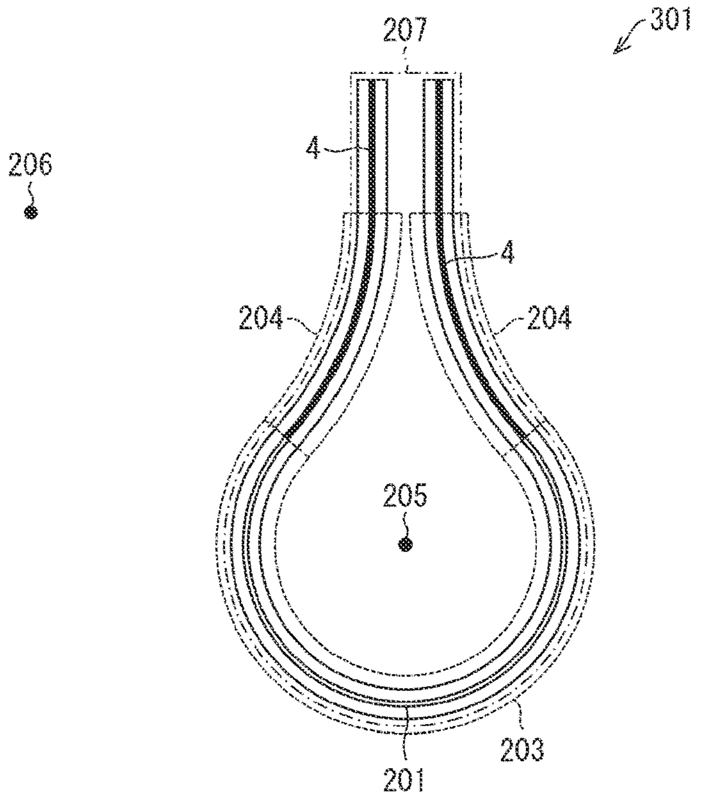
FIG. 19 is a sectional view of the foldable display shown in FIG. 17 and being folded.

FIG. 19 is a sectional view of the foldable display 301 being folded. FIG. 19 simply illustrates where the slit 201 and the shock absorption layer 4 are located in the foldable display 301 being folded. FIG. 19 illustrates only the outline of the foldable display 301, the slit 201, and the shock absorption layer 4. The foldable display 301 in FIG. 19 is folded into a droplet shape. In other words, in FIG. 19, the bending portion F (see FIG. 17 for instance) is bent in such a manner that the foldable display 301 is folded into a droplet shape.

The foldable display 301 in FIG. 19 can be regarded as including an inside-bending region 203 and an outside-bending region 204. The inside-bending region 203 can be defined as a region having the bending center, 205, of the inside-bending region 203 located inside the foldable display 301 being folded. The outside-bending region 204 can be defined as a region having the bending center, 206, of the outside-bending region 204 located outside the foldable display 301 being folded. The inside (outside) of the foldable display 301 being folded, to be more specific, corresponds to the inside (outside) of an outline 207, which is defined by the outer surface of the foldable display 301 being folded.

The slit 201 extends all over the inside-bending region 203. The shock absorption layer 4 is not disposed in the inside-bending region 203 but is disposed in only the outside-bending region 204.

In the example shown in FIG. 19, the slit 201 is not disposed in the outside-bending region 204. In some embodiments, the slit 201 may be disposed in the outside-bending region 204. In some embodiments, a plurality of slits 201 may be disposed in the inside-bending region 203 and/or the outside-bending region 204.

Modification

Figure 20:
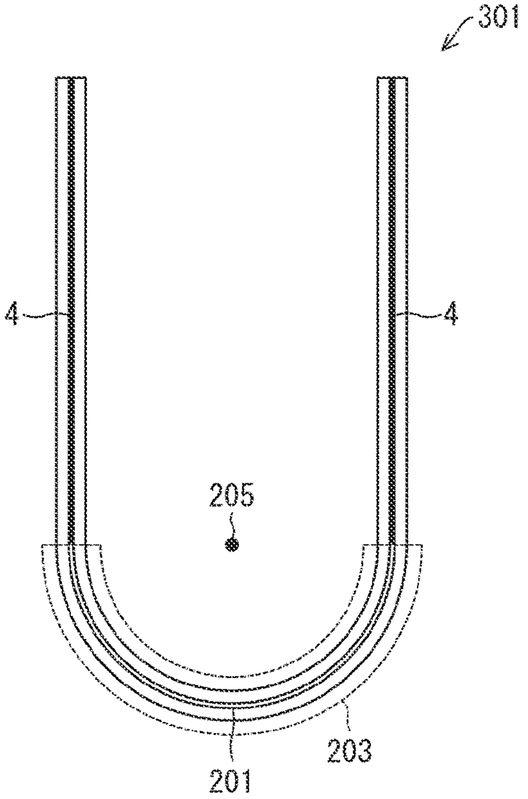
FIG. 20 is a sectional view of a modification of the foldable display shown in FIG. 17 and being folded.

FIG. 20 is a sectional view of a modification of the foldable display 301 being folded. FIG. 20 simply illustrates where the slit 201 and the shock absorption layer 4 are located in the foldable display 301 being folded. FIG. 20 illustrates only the outline of the foldable display 301, the slit 201, and the shock absorption layer 4. The foldable display 301 in FIG. 20 is folded into a U-shape. In other words, in FIG. 20, the bending portion F (see FIG. 17 for instance) is bent in such a manner that the foldable display 301 is folded into a U-shape.

The foldable display 301 folded in FIG. 20, which has a right U-shape, can be regarded as not including the outside-bending region 204 (see FIG. 19). That the slit 201 is disposed all over the inside-bending region 203 and that the shock absorption layer 4 is not disposed in the inside-bending region 203 are the same as those in the example shown in FIG. 19 and the example shown in FIG. 20.

The foregoing configuration can reduce a stress that is produced in a direction where each layer constituting the stacked structure in the foldable display 301 is peeled off, and that results from the folding of the foldable display 301.

The foldable display 301 folded can include the outside-bending region 204 when having a shape departing from a right U-shape.

In the example shown in FIG. 20, the slit 201 is disposed in only the inside-bending region 203. In some embodiments, the slit 201 may be disposed in a region other than the inside-bending region 203. In some embodiments, a plurality of slits 201 may be disposed in the inside-bending region 203 and/or a region other than the inside-bending region 203.

Second Embodiment

Figure 21:
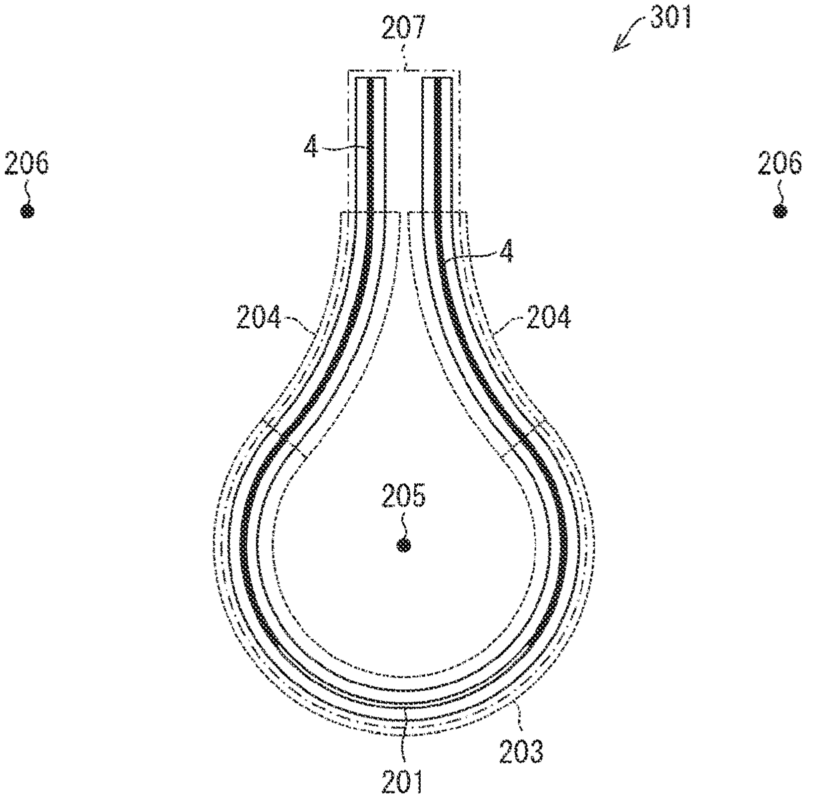
FIG. 21 is a sectional view of another example of the foldable display shown in FIG. 17 and being folded.

FIG. 21 is a sectional view of another example of the foldable display 301 being folded. The example shown in FIG. 21 is different from the example shown in FIG. 19 in the following point.

The slit 201 is disposed in part of the inside-bending region 203. The shock absorption layer 4 is disposed in part of the inside-bending region 203 in addition to the outside-bending region 204.

This can increase the formation area of the shock absorption layer 4, thereby considerably reducing the possibility of poor display.

Modification

Figure 22:
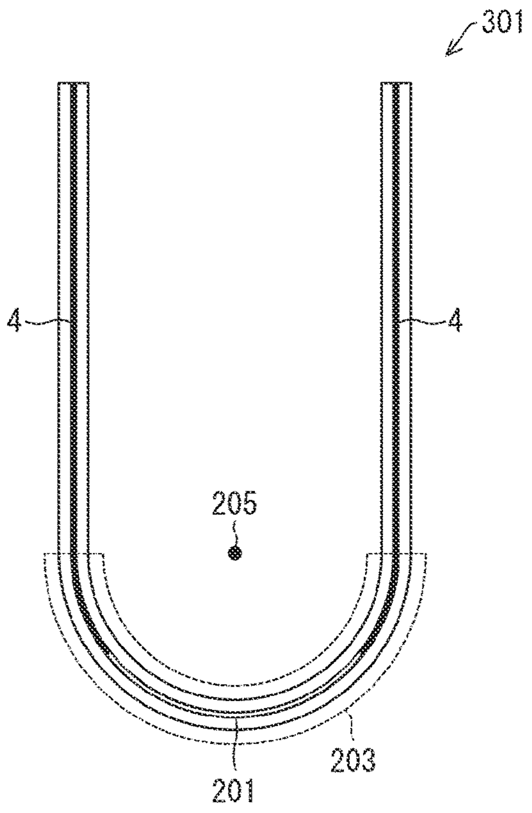
FIG. 22 is a sectional view of another modification of the foldable display shown in FIG. 17 and being folded.

FIG. 22 is a sectional view of another modification of the foldable display 301 being folded. The example shown in FIG. 22 is different from the example shown in FIG. 20 in the following point.

The slit 201 is disposed in part of the inside-bending region 203. The shock absorption layer 4 is disposed in part of the inside-bending region 203.

This can increase the formation area of the shock absorption layer 4, thereby considerably reducing the possibility of poor display.

Third Embodiment

Figure 23:
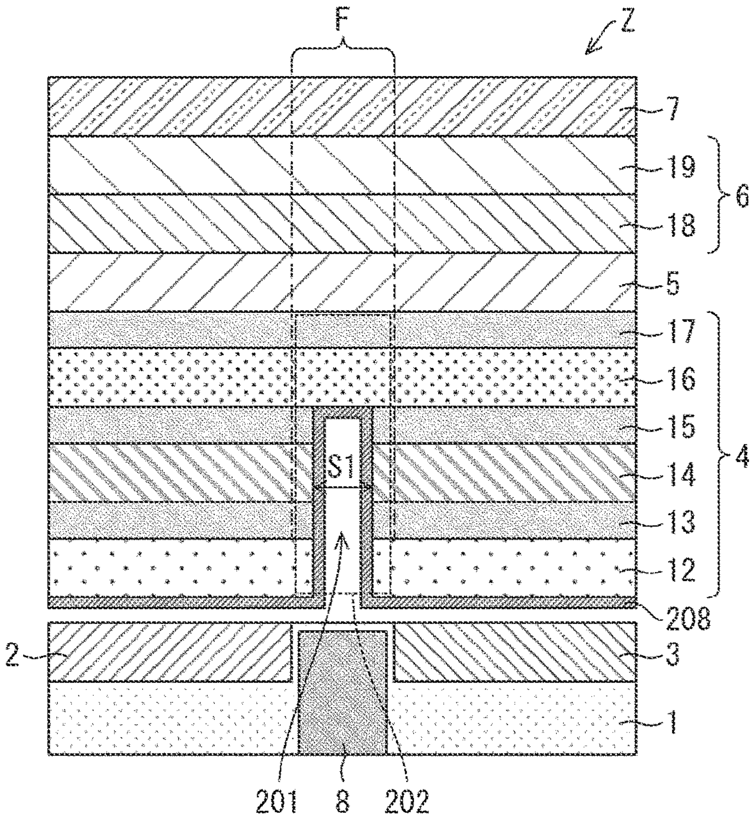
FIG. 23 is a detailed sectional view of an example of Range Z in the schematic configuration of a foldable display according to a third embodiment of the disclosure.

FIG. 23 is a detailed sectional view of an example of Range Z (see FIG. 18) in the schematic configuration of a foldable display according to a third embodiment of the disclosure. Range Z shown in FIG. 23 is different from Range Z shown in FIG. 18 in that a thermal-diffusion sheet 208 is provided.

The thermal-diffusion sheet 208 is disposed between the first support substrate 2 as well as the second support substrate 3, and the shock absorption layer 4. The thermal-diffusion sheet 208 is composed of a graphite sheet, a resin having flexibility (e.g., polyimide), and an adhesive layer for instance, and the thermal-diffusion sheet 208 is glued to the plastic film 12 of the shock absorption layer 4 by the adhesive layer. The thermal-diffusion sheet 208 can be regarded as one example of the foregoing thermal-diffusion function layer.

The thermal-diffusion sheet 208 is not provided with the slit 201. The thermal-diffusion sheet 208 has, in the section shown in FIG. 23, a dent shape extending along an inner wall defining the slit 201.

Fourth Embodiment

Figure 24:
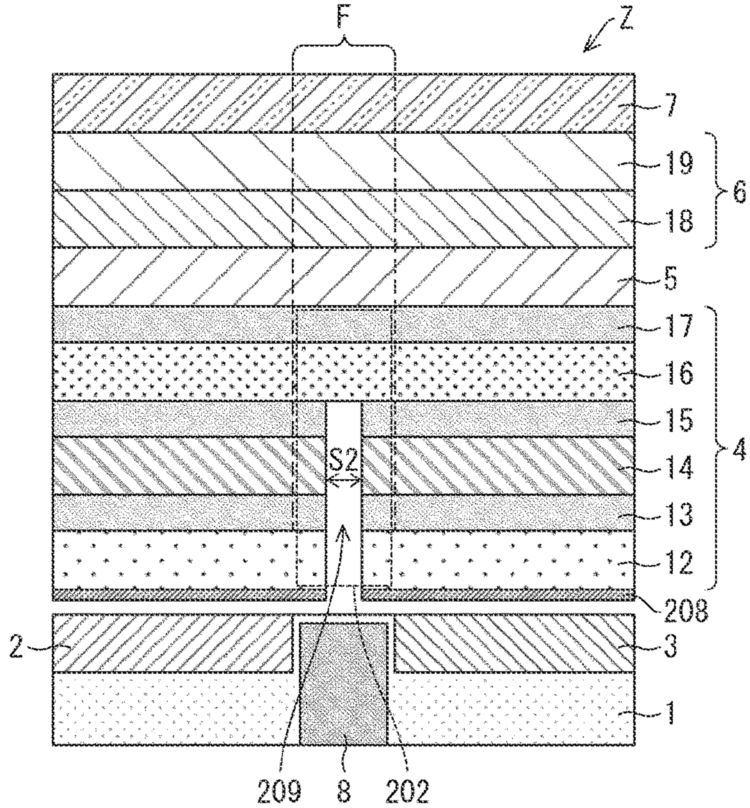
FIG. 24 is a detailed sectional view of an example of Range Z in the schematic configuration of a foldable display according to a fourth embodiment of the disclosure.

FIG. 24 is a detailed sectional view of an example of Range Z (see FIG. 18) in the schematic configuration of a foldable display according to a fourth embodiment of the disclosure. Range Z shown in FIG. 24 is different from Range Z shown in FIG. 23 in the following point.

The difference lies in a slit 209 disposed in the thermal-diffusion sheet 208, unlike the slit 201. The slit 209 extends from the surface adjacent to the first support substrate 2 and second support substrate 3, sequentially to the thermal-diffusion sheet 208, the plastic film 12, the adhesive layer 13, the metal film 14, and the adhesive layer 15. The thermal-diffusion sheet 208 is not disposed along an inner wall defining the slit 209. The width of the slit 209 is denoted by S2. The width S2 is smaller than the width S1.

This can increase the formation area of the shock absorption layer 4, thereby considerably reducing the possibility of poor display.

The foregoing configuration can prevent a stress that is caused by the thermal-diffusion sheet 208 when the foldable display is folded, from hindering the bending of the bending portion F. This can achieve a foldable display that is easy to fold.

The formation position of the slit 209 in the inside-bending region 203 and/or the outside-bending region 204 (see FIG. 19) can be similar to that of the slit 201. The same holds true for a slit 210 and a slit 211, which will be described later on.

Figure 25:
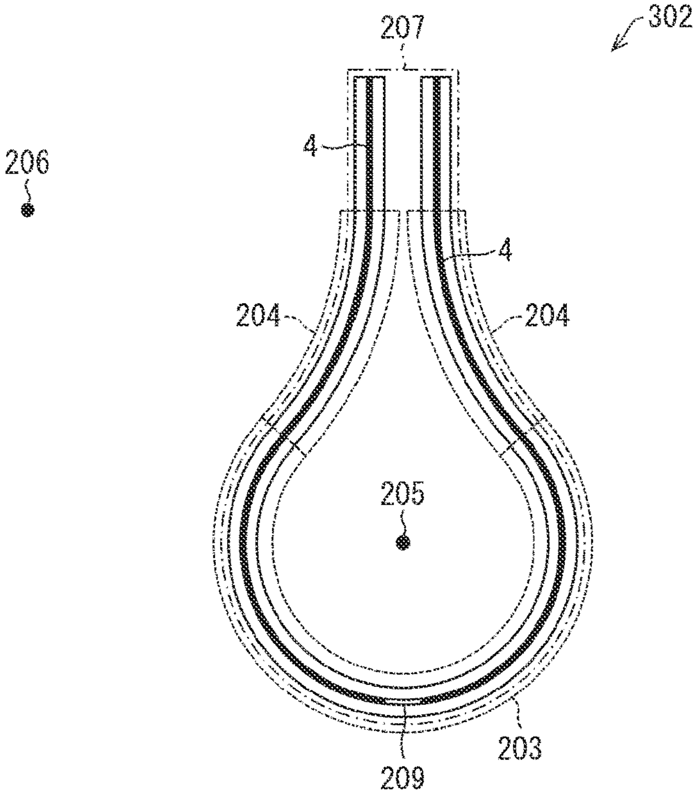
FIG. 25 is a sectional view of an example of the foldable display according to the fourth embodiment of the disclosure being folded.

FIG. 25 is a sectional view of an example of the foldable display, 302, according to the fourth embodiment of the disclosure being folded. The example shown in FIG. 25 is different from the example shown in FIG. 21 in the following point.

The slit 209 is disposed in a small part of the inside-bending region 203. The shock absorption layer 4 is disposed in a great part of the inside-bending region 203.

This can increase the formation area of the shock absorption layer 4, thereby considerably reducing the possibility of poor display.

Modification

Figure 26:
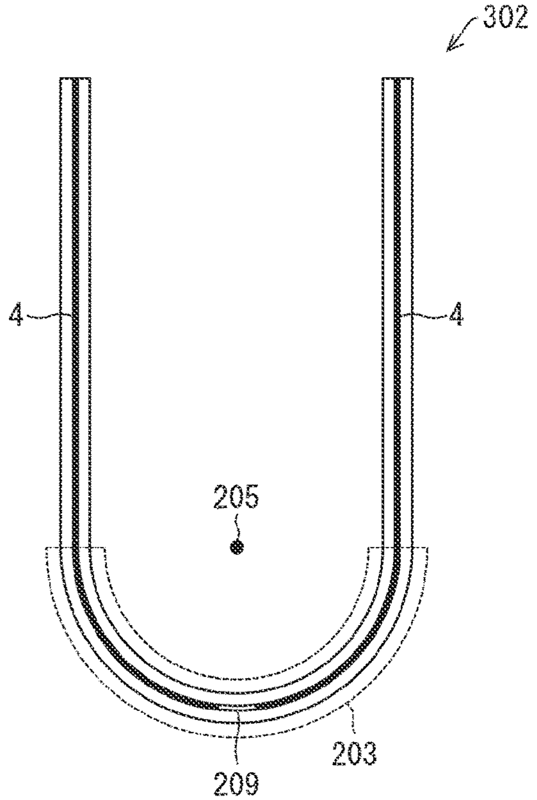
FIG. 26 is a sectional view of a modification of the foldable display according to the fourth embodiment of the disclosure being folded.

FIG. 26 is a sectional view of a modification of the foldable display 302 according to the fourth embodiment of the disclosure being folded. The example shown in FIG. 26 is different from the example shown in FIG. 22 in the following point.

The slit 209 is disposed in a small part of the inside-bending region 203. The shock absorption layer 4 is disposed in a great part of the inside-bending region 203.

This can increase the formation area of the shock absorption layer 4, thereby considerably reducing the possibility of poor display.

Fifth Embodiment

Figure 27:
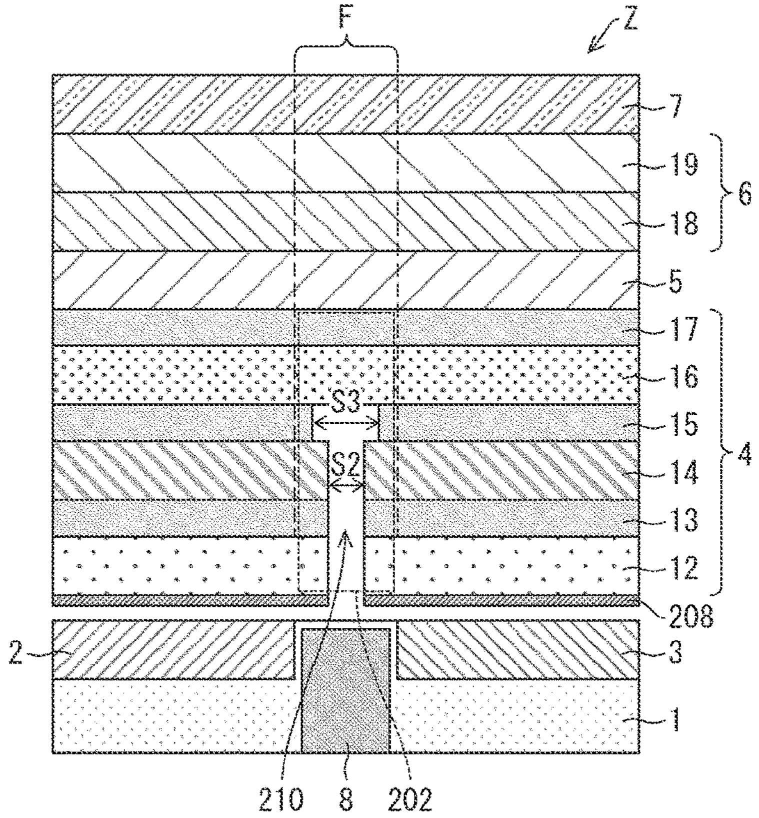
FIG. 27 is a detailed sectional view of an example of Range Z in the schematic configuration of a foldable display according to a fifth embodiment of the disclosure.

FIG. 27 is a detailed sectional view of an example of Range Z (see FIG. 18) in the schematic configuration of a foldable display according to a fifth embodiment of the disclosure. Range Z shown in FIG. 27 is different from Range Z shown in FIG. 24 in the following point.

The difference lies in that unlike the slit 209, the slit 210 has two kinds of width: the width S2 and a width S3. The width of the slit 210 extending in the thermal-diffusion sheet 208, plastic film 12, adhesive layer 13, and metal film 14 measures the width S2. The width of the slit 210 extending in the adhesive layer 15 measures the width S3. The width S3 is larger than the width S2.

Figure 28:
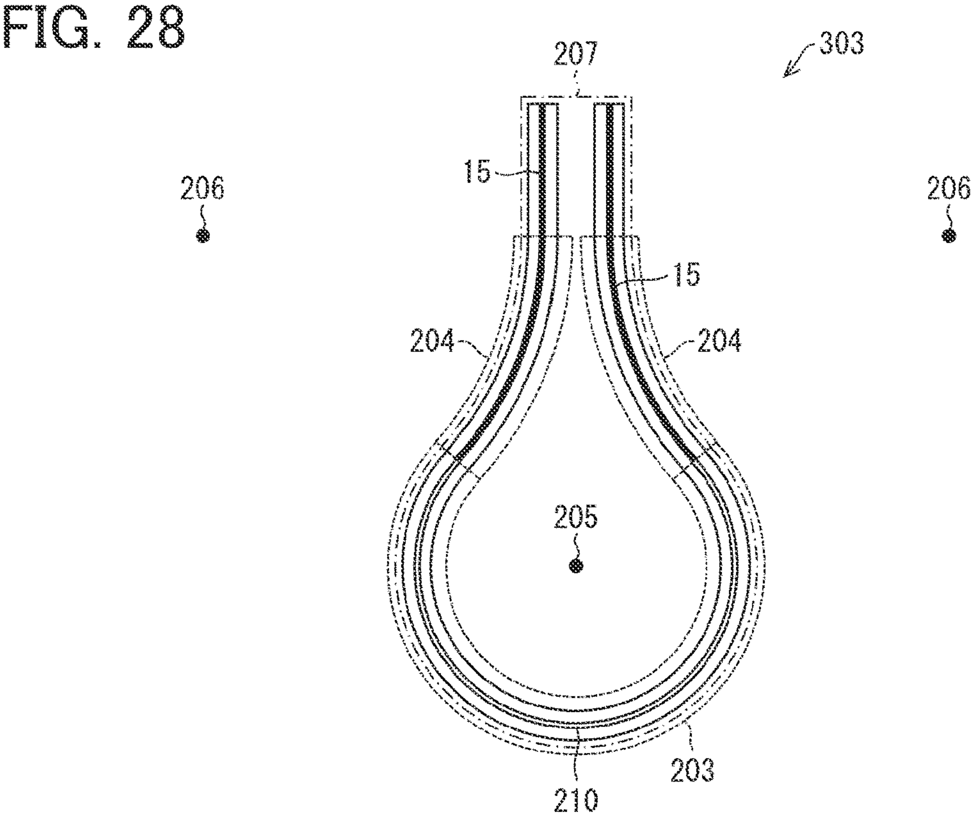
FIG. 28 is a sectional view of an example of the foldable display according to the fifth embodiment of the disclosure being folded.

FIG. 28 is a sectional view of an example of the foldable display, 303, according to the fifth embodiment of the disclosure being folded. A location where the slit 210 is disposed in the adhesive layer 15 may include only the inside-bending region 203, as illustrated in FIG. 28.

Figure 29:
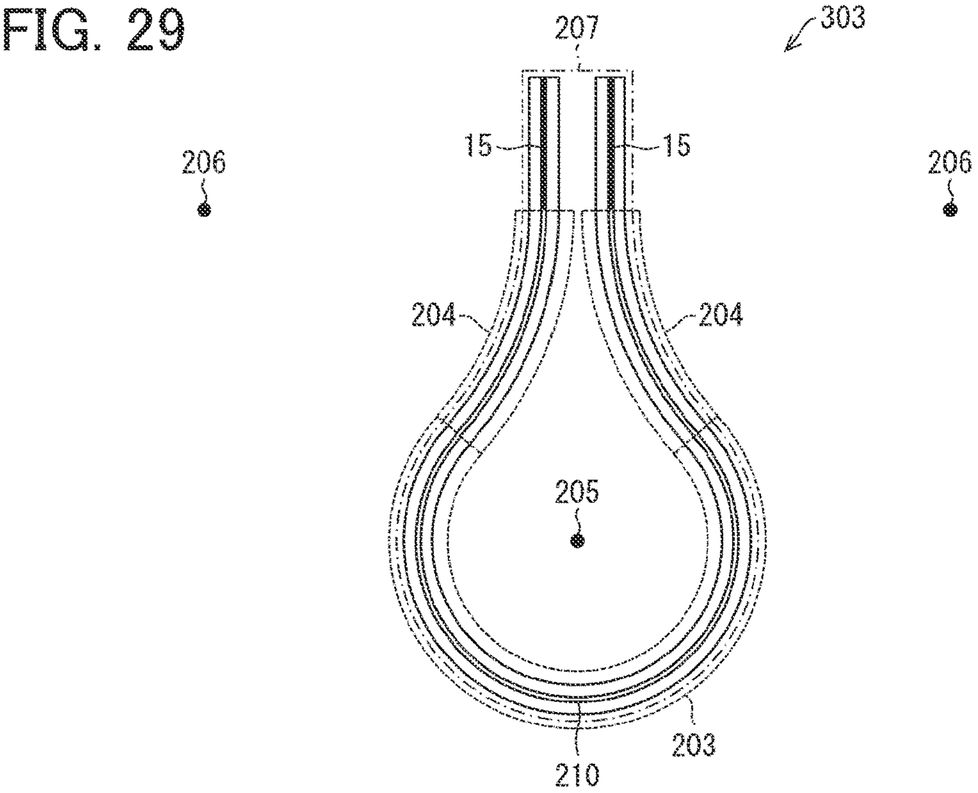
FIG. 29 is a sectional view of another example of the foldable display according to the fifth embodiment of the disclosure being folded.

FIG. 29 is a sectional view of another example of the foldable display 303 being folded. A location where the slit 210 is disposed in the adhesive layer 15 may include both the inside-bending region 203 and the outside-bending region 204, as illustrated in FIG. 29.

Sixth Embodiment

Figure 30:
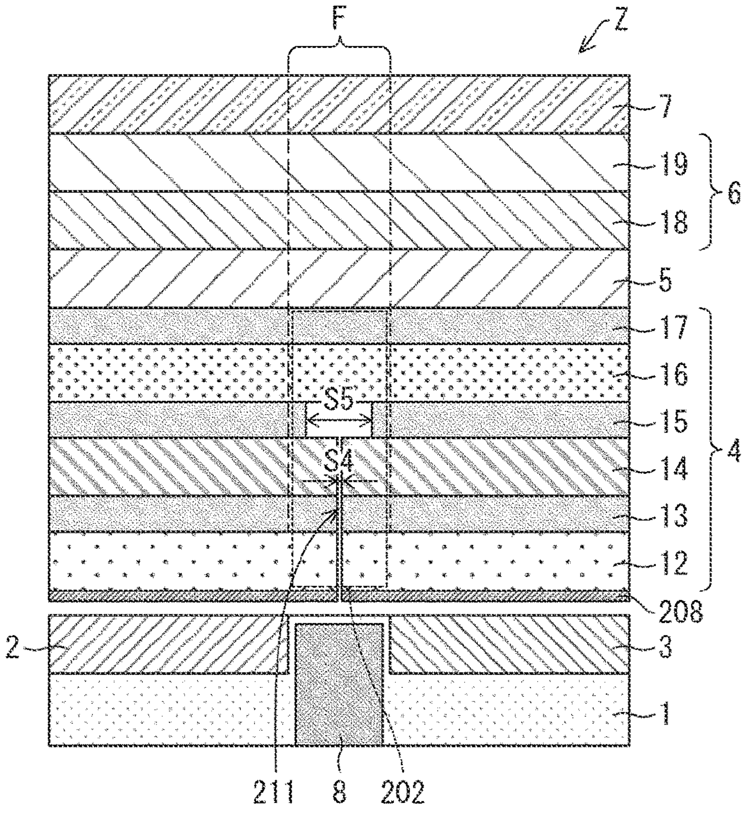
FIG. 30 is a detailed sectional view of an example of Range Z in the schematic configuration of a foldable display according to a sixth embodiment of the disclosure.

FIG. 30 is a detailed sectional view of an example of Range Z (see FIG. 18) in the schematic configuration of a foldable display according to a sixth embodiment of the disclosure. Range Z shown in FIG. 30 is different from Range Z shown in FIG. 27 in the following point.

The difference lies in that unlike the slit 210, the slit 211 has two kinds of width: a width S4 and a width S5. The width of the slit 211 extending in the thermal-diffusion sheet 208, plastic film 12, adhesive layer 13, and metal film 14 measures the width S4. The width of the slit 211 extending in the adhesive layer 15 measures the width S5. The width S4 is smaller than the width S2 (see FIG. 24) and is a quite small width measuring almost zero (e.g., about 0.5 mm). The width S5 is as large as the width S3 (see FIG. 27). The width S4 is extremely smaller than the width S5.

This can increase the formation area of the shock absorption layer 4, thereby considerably reducing the possibility of poor display.

Figure 31:
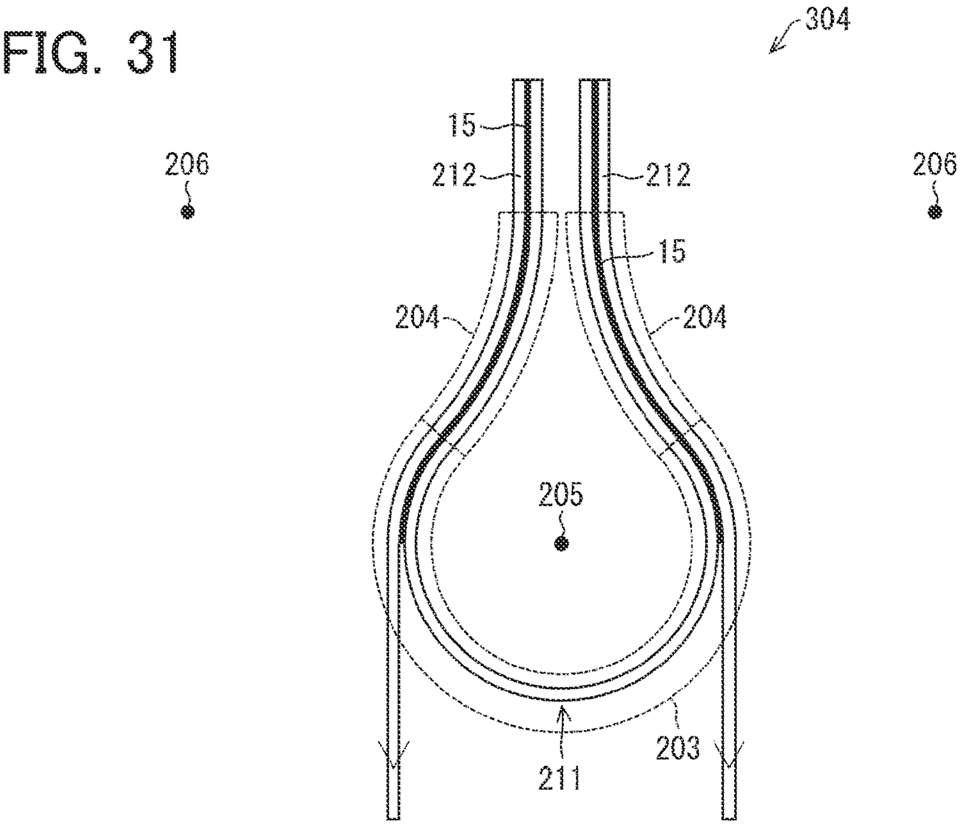
FIG. 31 is a sectional view of an example of the foldable display according to the sixth embodiment of the disclosure being folded.
Figure 32:
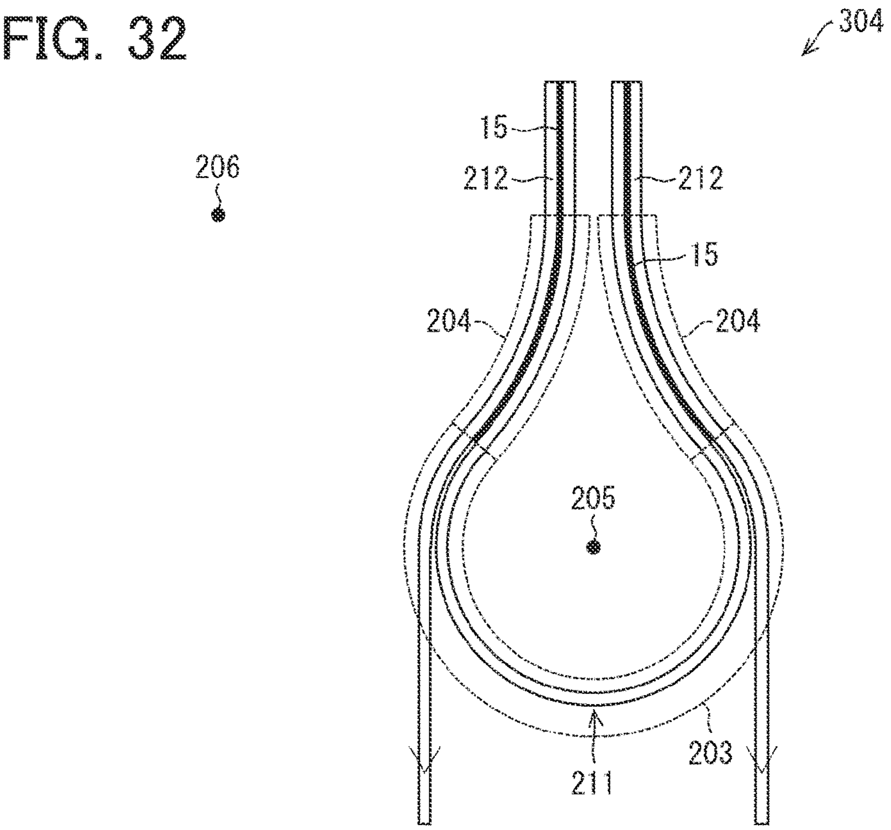
FIG. 32 is a sectional view of another example of the foldable display according to the sixth embodiment of the disclosure being folded.
Figure 33:
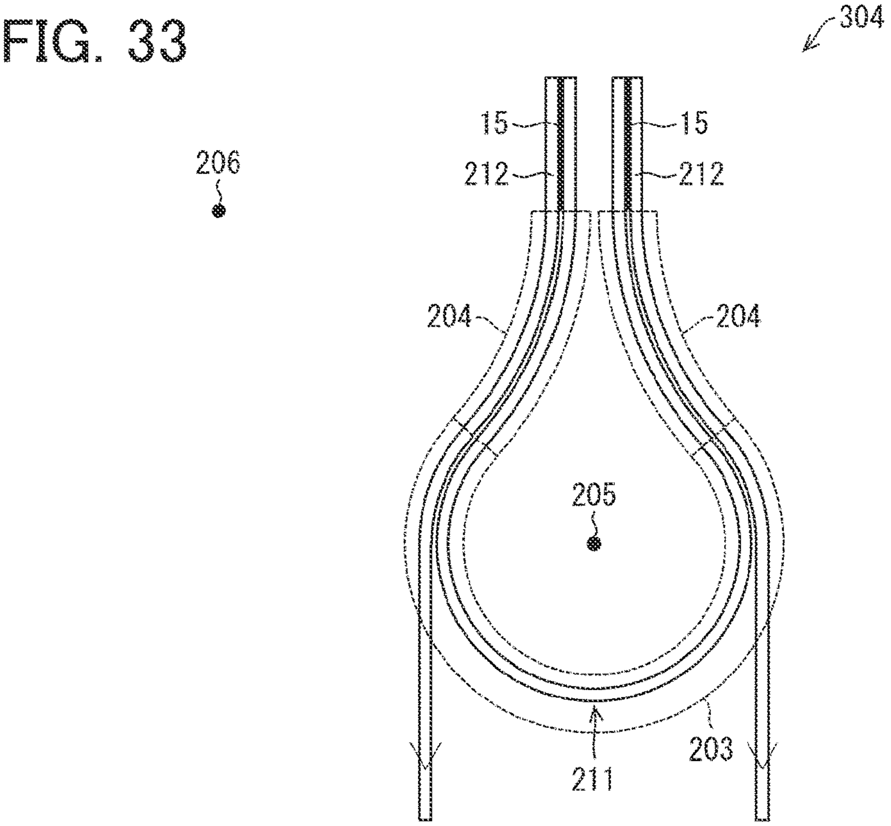
FIG. 33 is a sectional view of further another example of the foldable display according to the sixth embodiment of the disclosure being folded.

FIG. 31 is a sectional view of an example of the foldable display, 304, according to the sixth embodiment of the disclosure being folded. FIG. 31, as well as FIG. 32 and FIG. 33 described later on, shows a stacked structure 212, which corresponds to a stacked structure of the thermal-diffusion sheet 208, plastic film 12, adhesive layer 13, and metal film 14. As illustrated in FIG. 31, a location where the slit 211 is disposed in the adhesive layer 15 may have an arc shape of a semicircle having the bending center 205 as its center. Moreover, the width S4 is quite small and extremely smaller than the width S5; thus the stacked structure 212 not facing the adhesive layer 15 does not conform to the folding shape (a droplet shape in FIG. 31) of the foldable display 304 even when the foldable display 304 is folded. With the foldable display 304 folded, the stacked structure 212 separated into two parts with the slit 211 interposed therebetween (i.e., at least the adhesive layer separated into two parts) is consequently arranged in parallel with each other. This can reduce a load on the stacked structure 212 resulting from the folding of the foldable display 304. That the stacked structure 212 separated into two parts is arranged in parallel with each other herein refers to that the two separated stacked structures 212 are ideally symmetric with respect to a line passing through the bending center 205 and the center of the inside-bending region 203 (i.e., a straight line parallel to the up-and-down direction of FIG. 31). However, this arrangement also includes an arrangement in which these structures are not completely symmetric (an example shown in each of FIG. 32 and FIG. 33 is also included, which will be described later on). Such an incompletely symmetric arrangement is caused by, but not limited to, variations in manufacture process steps.

FIG. 32 is a sectional view of another example of the foldable display 304 being folded. A location where the slit 211 is disposed in the adhesive layer 15 may include only the inside-bending region 203, as illustrated in FIG. 32. With the foldable display 304 folded in FIG. 32, the stacked structure 212 separated into two parts with the slit 211 interposed therebetween is arranged in parallel with each other.

FIG. 33 is a sectional view of further another example of the foldable display 304 being folded. A location where the slit 211 is disposed in the adhesive layer 15 may include both the inside-bending region 203 and the outside-bending region 204, as illustrated in FIG. 33. With the foldable display 304 folded in FIG. 33, the stacked structure 212 separated into two parts with the slit 211 interposed therebetween is arranged in parallel with each other.

SUMMARY

A foldable display according to a first aspect of the disclosure includes the following: a display layer having flexibility, the display layer including a first display region, a second display region, and a third display region located between the first display region and the second display region; a cover having flexibility and covering the display layer; a first support substrate having inflexibility and supporting the first display region; a second support substrate having inflexibility and supporting the second display region; a bending portion including the third display region and being bendable; and a shock absorption layer disposed between the display layer and the first support substrate as well as between the display layer and the second support substrate. The shock absorption layer has a slit disposed in a portion overlapping the bending portion.

In the foregoing configuration, a local shock is dispersed or absorbed by the shock absorption layer when applied to the foldable display. As a result of this shock, the display layer receives a low-strength shock actually. This can reduce the possibility of poor display resulting from a breakdown of the display layer, and the possibility of poor display, such as a bright spot, a dark spot, or other things appearing on a display through the display layer.

In the foregoing configuration, the shock absorption layer has a slit disposed in a portion overlapping the bending portion. This can prevent a stress that is caused by the shock absorption layer when the foldable display is folded, from hindering the bending of the bending portion. This can achieve a foldable display that is easy to fold.

In the first aspect, the foldable display according to a second aspect of the disclosure includes an inside-bending region having a bending center located inside the foldable display being folded. The slit is disposed in at least the inside-bending region.

In the first or second aspect, the foldable display according to a third aspect of the disclosure is configured such that the bending portion is bent in such a manner that the foldable display is folded into a droplet shape.

In the first or second aspect, the foldable display according to a fourth aspect of the disclosure is configured such that the bending portion is bent in such a manner that the foldable display is folded into a U-shape.

The foregoing configuration can reduce a stress that is produced in a direction where each layer constituting the stacked structure in the foldable display is peeled off, and that results from the folding of the foldable display.

In the first aspect, the foldable display according to a fifth aspect of the disclosure includes an outside-bending region having a bending center located outside the foldable display being folded. The shock absorption layer is disposed in the outside-bending region.

In the fifth aspect, the foldable display according to a sixth aspect of the disclosure includes an inside-bending region having a bending center located inside the foldable display being folded. The shock absorption layer is disposed further in the inside-bending region.

The foregoing configuration can increase the formation area of the shock absorption layer, thereby considerably reducing the possibility of poor display.

In any of the first to sixth aspects, the foldable display according to a seventh aspect includes a thermal-diffusion sheet disposed between the first support substrate as well as the second support substrate and the shock absorption layer.

In the seventh aspect, the foldable display according to an eighth aspect of the disclosure is configured such that the slit is disposed in the thermal-diffusion sheet.

The foregoing configuration can prevent a stress that is caused by the thermal-diffusion sheet when the foldable display is folded, from hindering the bending of the bending portion. This can achieve the foldable display that is easy to fold.

In the seventh or eighth aspect, the foldable display according to a ninth aspect of the disclosure is configured such that the thermal-diffusion sheet has a graphite sheet, a resin having flexibility, and an adhesive layer.

In any of the first to ninth aspects, the foldable display according to a tenth aspect of the disclosure is configured such that the shock absorption layer has the following: a first plastic film (plastic film 16); a second plastic film (plastic film 12) disposed opposite the display layer when viewed from the first plastic film; and a metal film interposed between the first plastic film and the second plastic film.

The foregoing configuration can achieve the shock absorption layer with high performance of shock absorption.

In the tenth aspect, the foldable display according to an eleventh aspect of the disclosure is configured such that the second moment of area of the metal film overlapping the bending portion (overlap portion 24) is smaller than the second moment of area of the metal film overlapping the first support substrate, and is smaller than the second moment of area of the metal film overlapping the second support substrate.

In the eleventh aspect, the foldable display according to a twelfth aspect of the disclosure is configured such that the metal film overlapping the bending portion has a grating shape, a lattice shape, or a chain shape in a plan view of the foldable display.

In the twelfth aspect, the foldable display according to a thirteenth aspect of the disclosure is configured such that the metal film in whole has a grating shape, a lattice shape, or a chain shape in the plan view of the foldable display.

The forgoing configuration is suitable when the size of the entire metal film is small.

In any of the tenth to thirteenth aspects, the foldable display according to a fourteenth aspect of the disclosure is configured such that the shock absorption layer has an adhesive layer disposed in at least one of a location between the first plastic film and the metal film, and a location between the second plastic film and the metal film.

In the fourteenth aspect, the foldable display according to a fifteenth aspect of the disclosure is configured such that an air layer is disposed within the adhesive layer.

In the foregoing configuration, providing the air layer within the adhesive layer enables the metal film to vibrate upon receiving a shock. When the metal film vibrates upon receiving the shock, positional energy based on the shock is partly converted into kinetic energy. This can reduce physical damage to the foldable display effectively.

In the fourteenth or fifteenth aspect, the foldable display according to a sixteenth aspect of the disclosure is configured such that at least the adhesive layer is separated into a plurality of parts with the bending portion interposed therebetween.

The foregoing configuration can reduce the number of components that are included in the bending portion, thereby allowing the bending portion to be easily bent.

In the fourteenth or fifteenth aspect, the foldable display according to a seventeenth aspect of the disclosure is configured such that at least the adhesive layer is separated into two parts with the bending portion interposed therebetween, and such that with the foldable display folded, the at least adhesive layer separated into the two parts is arranged in parallel with each other.

The foregoing configuration can reduce a load on at least the adhesive layer resulting from the folding of the foldable display.

In any of the tenth to seventeenth aspects, the foldable display according to an eighteenth aspect of the disclosure is configured such that the metal film contains at least one of stainless steel, aluminum, and copper.

In any of the tenth to eighteenth aspects, the foldable display according to a nineteenth aspect of the disclosure is configured such that the metal film has a thickness of 10 to 100 μm inclusive.

In any of the tenth to nineteenth aspects, the foldable display according to a twentieth aspect of the disclosure is configured such that the first plastic film contains at least one of polyimide, PET, PEN, COC and aramid.

In any of the tenth to twentieth aspects, the foldable display according to a twenty-first aspect of the disclosure is configured such that the second plastic film contains at least one of PET, urethane-based resin, polyester-based resin, acrylic-based resin, and polycarbonate resin.

In any of the tenth to twenty-first aspects, the foldable display according to a twenty-second aspect of the disclosure is configured such that the first plastic film has a Young's modulus larger than the Young's modulus of the second plastic film.

In any of the tenth to twenty-second aspects, the foldable display according to a twenty-third aspect of the disclosure is configured such that the first plastic film is thicker than the metal film, and such that the second plastic film is as thick as the first plastic film or is thicker than the first plastic film.

In any of the tenth to twenty-third aspects, the foldable display according to a twenty-fourth aspect of the disclosure is configured such that the second plastic film is a stacked structure of a plurality of layers containing materials different from each other.

In any of the tenth to twenty-fourth aspects, the foldable display according to a twenty-fifth aspect of the disclosure is configured such that the first plastic film has an elasticity coefficient of 1 to 10 GPa inclusive.

The foregoing configuration can sufficiently weaken a shock that is received by the metal film, thereby reducing the possibility that the metal film cannot disperse the shock fully.

In any of the tenth to twenty-fifth aspects, the foldable display according to a twenty-sixth aspect of the disclosure includes a thermal-diffusion function layer being adjacent to the second plastic film when viewed from the metal film.

In the foregoing configuration, thermal diffusion (heat dissipation) can prevent thermal damage to the light-emitting elements within the display layer, thereby prolonging the life of the foldable display.

In any one of the first to twenty-sixth aspects, the foldable display according to a twenty-seventh aspect of the disclosure includes a touch panel disposed between the display layer and the cover.

The foregoing configuration enables the foldable display to have a touch panel function associated with display through the display layer.

The disclosure is not limited to the foregoing embodiments. Various modifications can be devised with the scope of the claims. An embodiment that is obtained in combination, as appropriate, with the technical means disclosed in the respective embodiments is also included in the technical scope of the disclosure. Furthermore, combining the technical means disclosed in the respective embodiments can form a new technical feature.

The invention claimed is:

1. A foldable display comprising:

a display layer having flexibility, the display layer including a first display region, a second display region, and a third display region located between the first display region and the second display region;

a cover having flexibility and covering the display layer;

a first support substrate having inflexibility and supporting the first display region;

a second support substrate having inflexibility and supporting the second display region;

a shock absorption layer disposed between the display layer and the first support substrate as well as between the display layer and the second support substrate; and a bending portion that is foldable and that includes the third display region, such that the first display region and the second display region oppositely face each other, wherein the shock absorption layer comprises:

a first plastic film, a second plastic film disposed on a side of the first plastic film opposite the display layer, a metal film interposed between the first plastic film and the second plastic film, the metal film having a slit disposed in a portion overlapping the bending portion, a first adhesive layer interposed between the first plastic film and the metal film, the first adhesive layer including a first removed portion in which at least a portion of an area of the first adhesive layer overlapping the bending portion is removed, and a second adhesive layer interposed between the second plastic film and the metal film, the second adhesive layer including a second removed portion in which at least a portion of an area of the second adhesive layer overlapping the bending portion is removed, the second plastic film is as thick as, or thicker than, the first plastic film, the first plastic film is harder than the second plastic film, and each of the first adhesive layer and the second adhesive layer is separated into a plurality of portions, with the bending portion interposed therebetween.

2. The foldable display according to claim 1, further comprising:

an inside-bending region having a bending center located inside the foldable display, wherein the slit is disposed in at least the inside-bending region.

3. The foldable display according to claim 1, wherein the bending portion is bent in such a manner that the foldable display is folded into a droplet shape.

4. The foldable display according to claim 1, wherein the bending portion is bent in such a manner that the foldable display is folded into a U-shape.

5. The foldable display according to claim 1, further comprising:

an outside-bending region having a bending center located outside the foldable display, wherein the shock absorption layer is disposed in the outside-bending region.

6. The foldable display according to claim 5, further comprising:

an inside-bending region having a bending center located inside the foldable display, wherein the shock absorption layer is further disposed in the inside-bending region.

7. The foldable display according to claim 1, further comprising a thermal-diffusion sheet disposed between the first support substrate and the shock absorption layer as well as between the second support substrate and the shock absorption layer.

8. The foldable display according to claim 7, wherein a second slit is disposed in the thermal-diffusion sheet.

9. The foldable display according to claim 7, wherein the thermal-diffusion sheet comprises a graphite sheet, a resin having flexibility, and an adhesive layer.

10. The foldable display according to claim 1, wherein a second moment of area of the portion of the metal film overlapping the bending portion is smaller than a second moment of area of a portion of the metal film overlapping the first support substrate, and is smaller than a second moment of area of a portion of the metal film overlapping the second support substrate.

11. The foldable display according to claim 10, wherein the portion of the metal film overlapping the bending portion has a grating shape, a lattice shape, or a chain shape in a plan view of the foldable display.

12. The foldable display according to claim 10, wherein the metal film in whole has a grating shape, a lattice shape, or a chain shape in a plan view of the foldable display.

13. The foldable display according to claim 1, wherein an air layer is disposed within the first adhesive layer or within the second adhesive layer.

14. The foldable display according to claim 1, wherein with the foldable display folded, two parts of the foldable display that are previously separated, with the bending portion interposed therebetween, are arranged in parallel with each other.

15. The foldable display according to claim 1, wherein the metal film has a thickness of 10 to 100 μm, inclusive.

16. The foldable display according to claim 1, wherein the first plastic film is thicker than the metal film.

17. The foldable display according to claim 1, further comprising a touch panel disposed between the display layer and the cover.

18. The foldable display according to claim 1, wherein the second plastic film has a second slit in a portion that overlaps the bending portion.

19. The foldable display according to claim 1, wherein a width of the first removed portion is different from a width of the second removed portion.

* * * * *